United States Patent [19]

Yamashina et al.

[11] Patent Number: 5,585,754
[45] Date of Patent: Dec. 17, 1996

[54] INTEGRATED DIGITAL CIRCUIT

[75] Inventors: Masakazu Yamashina; Masayuki Mizuno, both of Tokyo, Japan

[73] Assignee: NEC Corporation, Tokyo, Japan

[21] Appl. No.: 222,279

[22] Filed: Apr. 4, 1994

[30] Foreign Application Priority Data

Apr. 2, 1993  [JP]  Japan ................................ 5-077223
Mar. 25, 1994 [JP]  Japan ................................ 6-055775

[51] Int. Cl.$^6$ ............................................. H03K 5/13
[52] U.S. Cl. ..................... 327/158; 327/159; 327/276; 327/161; 327/244
[58] Field of Search ................... 327/243–245, 327/231, 233, 141, 144–147, 149, 150, 153, 155, 156, 158, 159, 161, 162, 269, 270, 274, 276–278, 280, 287

[56] References Cited

U.S. PATENT DOCUMENTS

| | | | |
|---|---|---|---|
| 4,494,021 | 1/1985 | Bell et al. | 327/270 |
| 4,899,071 | 2/1990 | Morales | 327/277 |
| 4,922,141 | 5/1990 | Lofgren et al. | 327/250 |
| 4,947,064 | 8/1990 | Kim et al. | 327/262 |
| 5,039,893 | 8/1991 | Tomisawa | 327/276 |
| 5,066,877 | 11/1991 | Hamano | 327/280 |
| 5,087,829 | 2/1992 | Ishibashi et al. | 327/158 |
| 5,105,108 | 4/1992 | Ngo | 327/276 |
| 5,122,679 | 6/1992 | Ishii et al. | 327/147 |
| 5,140,284 | 8/1992 | Petersson | 331/25 |
| 5,146,121 | 9/1992 | Searles et al. | 327/276 |
| 5,216,302 | 6/1993 | Tanizawa | 327/244 |
| 5,223,755 | 6/1993 | Richley | 327/277 |
| 5,295,164 | 3/1994 | Yamamura | 327/159 |
| 5,317,202 | 5/1994 | Waizman | 327/156 |
| 5,355,037 | 10/1994 | Andressen et al. | 327/277 |

OTHER PUBLICATIONS

IEICE Trans. Electron, vol. E75–C. No. 10 Oct. 1992, "An MOS Current Mode Logic (MCML) Circuit for Low–Power Sub–GHz Processors" by Yamashina et al.

*Primary Examiner*—Timothy P. Callahan
*Assistant Examiner*—T. Lam
*Attorney, Agent, or Firm*—Whitham, Curtis, Whitham & McGinn

[57] ABSTRACT

An integrated digital circuit includes an oscillation circuit comprising basic gate circuits having the number of stages proportional to the number of gates existing in the critical path of a synchronized circuit network and capable of controlling an oscillating frequency by at least one control signal line. A synchronized circuit network constructed with basic gate circuits capable of controlling the delay time by at least one control signal line operates synchronously by an oscillation signal transfer line. A control circuit controls the oscillation circuit and the synchronized circuit network using the control signal line so that the frequency of signal input from an externally input signal line is equalized with the frequency of signal from the oscillation circuit. Thus, the synchronized circuit network can be always operated at the frequency obtained from the oscillation signal transfer line even though the delay time of the basic gate circuit varied by variations of the device characteristics and the like.

1 Claim, 20 Drawing Sheets

5,585,754

INTEGRATED DIGITAL CIRCUIT

BACKGROUND OF THE INVENTION

1. Field of the Invention

The present invention relates to an integrated digital circuit capable of achieving desired performance free from influences by any variations in device characteristics due to variations of such as a threshold value, a gate length and the like of transistors as well as any variations in specification such as a resistance value and a capacitance value of a wiring line and the like and changes of operating environments such as temperature, current source voltage and the like, and capable of achieving desired performance by compensating for the skew of synchronized signal supplied to the synchronized circuit in the integrated digital circuit.

2. Prior Art

Conventional integrated digital circuits consist of a CMOS circuit complementarily operating nMOS transistors and pMOS transistors, and ECL circuit using bipolar transistors, a BiCMOS circuit using both circuits thereof and the like.

FIG. 1 is a block diagram showing one example of the construction for the conventional integrated digital circuit. Referring to FIG. 1, a semiconductor integrated circuit 1 integrated with the conventional digital circuits comprises an oscillation circuit 2 having a CMOS circuit or and ECL or a BiCMOS circuit, a processor 3 having the CMOS circuit or the ECL circuit or the BiCMOS circuit, an external signal input line 6, and an oscillation signal transfer line 7.

The processor 3 comprises at least two registers 4 synchronized with the oscillation signal transfer line 7 and a logic circuit 5 connected between the registers 4 to synthesize logic. The frequency of the oscillation signal generated by the oscillation circuit 2 is controlled by the signal input through the external signal input line 6. The oscillation signal is input to the processor 3 through the oscillation signal transfer line 7 and transformed to the synchronized signal of the registers 4 so as to synchronized the operation of the processor 3.

The signal input through the external signal input line 6 functions either as a control signal to control the frequency of the oscillation signal output from the oscillation circuit 2 or as synchronizing signal to minimize any difference in the phases of the external signal input to the integrated circuit 1 and the oscillation signal from the oscillation circuit 2. In the latter case, the oscillation circuit 2 generates the signal synchronized with the synchronized signal externally input. Some conventional integrated digital circuits do not include the oscillation circuit 2. In these circuits, the oscillation signal should be input to the processor 3 directly from the outside of the semiconductor integrated circuit 1.

For the oscillation circuit 2, both basic gate circuits either capable of changing the delay time by the external control signal or not capable of changing the delay time by the external control signal are used. On the other hand, only the basic gate circuits not capable of externally controlling the delay time is used for the logic circuit 5.

In cases, however, these conventional integrated digital circuit could not achieve the performance targeted during circuit designing, resulting from variations the device characteristics due to variations of such as the threshold value, the gate length and the like of the transistors as well as any variations in specification such as the resistance value and the capacitance value of the line and the like and changes of operating environments such as temperature, current source voltage and the like.

Therefore, the conventional integrated digital circuit had to be designed to have about two times more than the desired performance, considering indeterminate factors such as the aforementioned variations and changes. If such margin is not large enough, the yield of product having acceptable quality level may significantly decrease. Furthermore, due to the skew of synchronized signal arriving to the registers in the synchronized signal supplied to at least two registers forming the synchronized circuit in the aforementioned conventional integrated digital circuit, the integrated digital circuit had to be designed to have sufficient allowance for this skew.

SUMMARY OF THE INVENTION

It is therefore an object of the present invention to provide an integrated digital circuit capable of achieving desired performance free from influences by any variations in the device characteristics due to variations of the threshold value and the gate length of transistors as well as any variations in specification such as the resistance value and the capacitance value and any changes of operating environments such as temperature and current source voltage, and also capable of achieving desired performance by compensating the skew of synchronized signal supplied to the synchronized circuit in the integrated digital circuit.

An integrated digital circuit according to the present invention comprises: a synchronized circuit network having a gate circuit inputting a control signal and being capable of changing a delay time by said control signal; an oscillation circuit having a plurality of gate circuits connected in ring form, the number of said gate circuits being proportional to the number of gates of a critical path in said synchronized circuit network and the gate circuit being capable of changing a delay time by said control signal; and a control circuit outputting said control signal for controlling said synchronized circuit network and said oscillation circuit so as to equalize a frequency of a signal output from said oscillation circuit with that of an external signal input externally.

Also, an integrated digital circuit according to the present invention comprises: a synchronized circuit network having a gate circuit inputting a control signal and being capable of changing a delay time by said control signal; a replica delay circuit having a plurality of gate circuits connected in a line, the number of said plurality of gate circuits being proportional to the number of gates of a critical path in said synchronized circuit network and the gate circuit being capable of changing a delay time by said control signal, and said replica delay circuit inputting an external signal input externally; and a control circuit outputting said control signal for controlling said synchronized circuit network and said replica delay circuit so as to equalize a phase of a signal output from said replica delay circuit with a phase determined based on a phase of said external signal.

Also, an integrated digital circuit according to the present invention comprises: a synchronized circuit network having a gate circuit inputting a control signal and being capable of changing a delay time by said control signal; an oscillation circuit having a plurality of gate circuits connected in ring form, the number of said gate circuits being proportional to the number of gates of a critical path in said synchronized circuit network and the gate circuit being capable of changing a delay time by said control signal; a divider circuit dividing an output signal of said oscillation circuit; and a control circuit outputting said control signal for controlling said synchronized circuit network and said oscillation circuit so as to equalize the frequency of an output signal of said divider circuit with that of an external signal input externally.

Also, an integrated digital circuit according to the present invention comprises: at least two registers constructing a synchronized circuit, which input a synchronized signal; a circuit network constructing a logic circuit or a memory circuit and connected between at least two of said registers, the circuit network having a gate circuit inputting a control signal and being capable of changing a delay time by said control signal; a replica delay circuit having a plurality of gate circuits connected in a line, the number of said plurality of gate circuits being proportional to the number of gates of a critical path in said circuit network and the gate circuit being capable of changing a delay time by said control signal, and said replica delay circuit inputting said synchronized signal; and a control circuit outputting a control signal for controlling said delay times of said circuit network and said replica delay circuit so as to equalize a phase of a signal output from said replica delay circuit with a phase determined based on a phase of said synchronized signal.

Also, an integrated digital circuit according to the present invention comprises: at least two registers constructing a synchronized circuit, which input a synchronized signal; a circuit network constructing a logic circuit or a memory circuit and connected between at least two of said registers, the circuit network having a gate circuit inputting a first control signal and being capable of changing a delay time by said first control signal; a control signal generating circuit for generating a second and third control signals from said synchronized signal supplied to said registers; a replica delay circuit having a plurality of gate circuits connected in a line, the number of said plurality of gate circuits being proportional to the number of gates of a critical path in said circuit network and the gate circuit being capable of changing a delay time by said first control signal, and said replica delay circuit inputting said second control signal; and a control circuit outputting said first control signal for controlling said delay times of said circuit network and said replica delay circuit so as to equalize a phase of a signal output from said replica delay circuit with a phase determined based on a phase of said third control signal.

Also, an integrated digital circuit according to the present invention comprises: an oscillation circuit for outputting an oscillation signal, the oscillation circuit having arbitrary number of current mode circuits cascaded in ring-form, the current mode circuit inputting a first and a second control signals and having variable resistances capable of controlling the resistance value by said first control signal, a variable current source capable of controlling the current value by said second control signal, and differential pair of transistors constructing a logic or memory circuit; a processor having critical path gates equal to or less than the cascaded number of said current mode circuits of said oscillation circuit, the processor having a current mode circuit synchronized by the oscillation signal of said oscillation circuit; and an input terminal of an external signal for controlling the signal amplitude and the current value of said current mode circuits.

The present invention can provides the integrated digital circuit capable of operating always at the desired operating frequency even though the delay time of the basic gate circuits changed by variations of the device characteristics due to variations of the threshold value, the gate length and the like of the transistors as well as variations in specification such as the resistance value and the capacitance value of line and the like and changes of operating environments such as temperature, current source voltage and the like, using the synchronized circuit network comprising basic gate circuits capable of controlling the delay time, and controlling the delay time of said basic gate circuits using the simulator delay circuit having the number of stages proportional to the number of gates of critical path of the synchronized circuit network thereof.

Further, even though any skew of the synchronized signals arriving to the registers occurred in the synchronized signals supplied to at least two registers comprising the synchronized circuit within the integrated digital circuit, the present invention provides the integrated digital circuit capable of achieving the desired performance by compensating the skew.

DETAILED DESCRIPTION OF THE PREFERRED EMBODIMENTS

Figure 1:
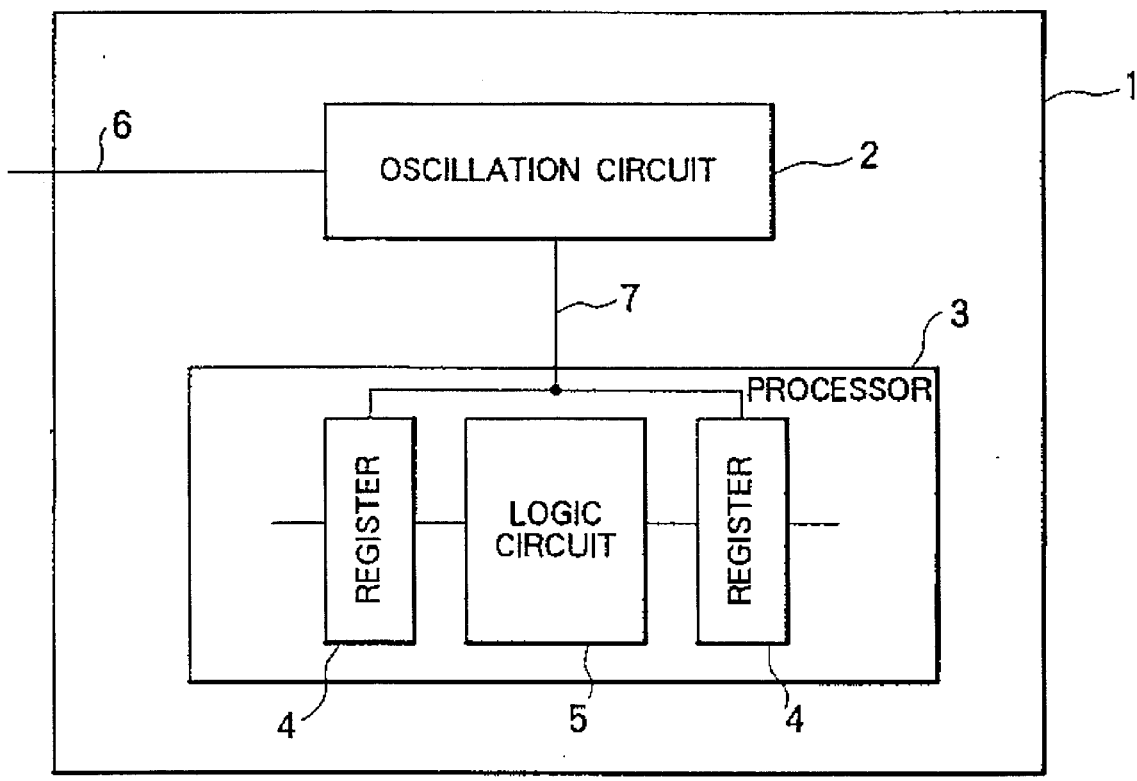
FIG. 1 is a block diagram showing the construction of a conventional integrated digital circuit.
Figure 2:
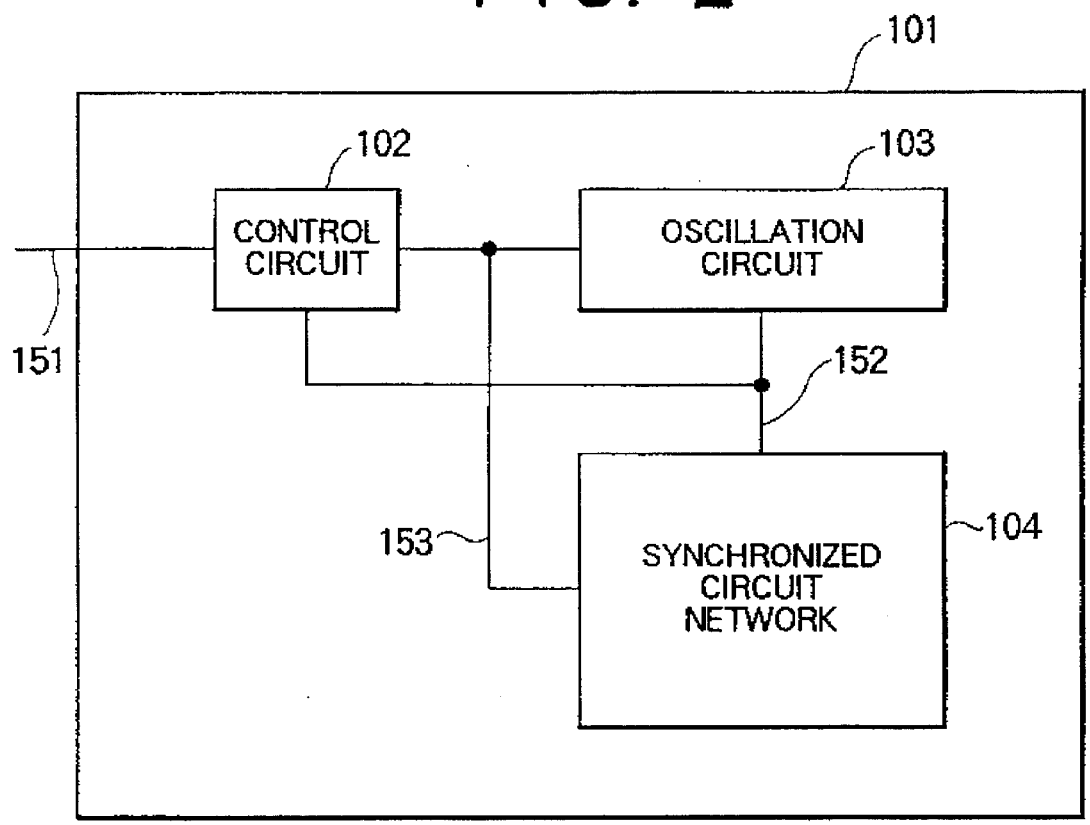
FIG. 2 is a block diagram showing the construction of an integrated digital circuit 101 according to the first embodiment of the present invention.

The integrated digital circuits according to the embodiments of the present invention now will be described hereinafter with reference to the drawings attached. FIG. 2 is a block diagram showing an integrated digital circuit according to the first embodiment of the present invention. Referring to FIG. 2, a semiconductor integrated circuit 101 integrated with the digital circuit according to this embodiment comprises an oscillation circuit 103 including basic gate circuits having the number of stages proportional to the number of gates existing at the critical path of a synchronized circuit network 104. The circuit 103 is capable of controlling each signal frequency by at least one control signal line 153. The synchronized circuit network 104 comprises basic gate circuits capable of controlling the delay time by at least one control signal line 153 and operating synchronously by an oscillation signal transfer line 152. A control circuit 102 controls the oscillation circuit 103 and the synchronized circuit network 104 through the control signal line 153 so as to equalize the frequency of signal input from an externally input signal line 151 to the frequency of signal of the oscillation signal transfer line 152.

Figure 3:
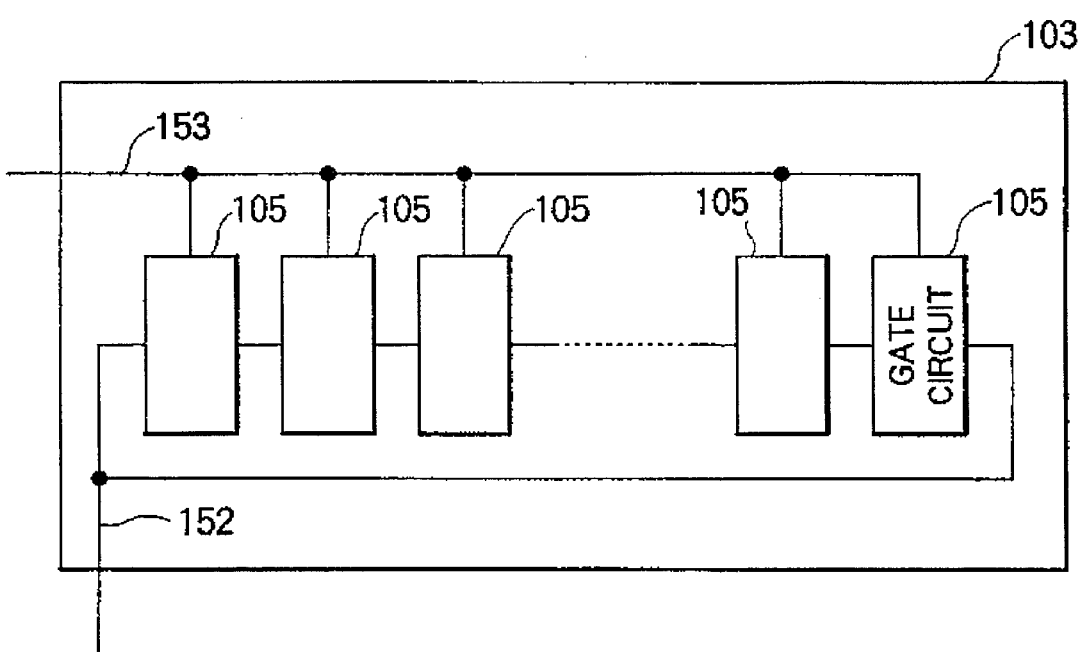
FIG. 3 is a block diagram showing one example of an oscillation circuit 103 in the first embodiment.

FIG. 3 is a block diagram showing the oscillation circuit 103. The oscillation circuit 103 includes basic gate circuits 105 connected in ring form and comprising the number of gates proportional to the number of gates of the critical path of the synchronized circuit network 104. The delay time of the basic gate circuits 105 can be controlled by the control signal line 153.

Figure 9:
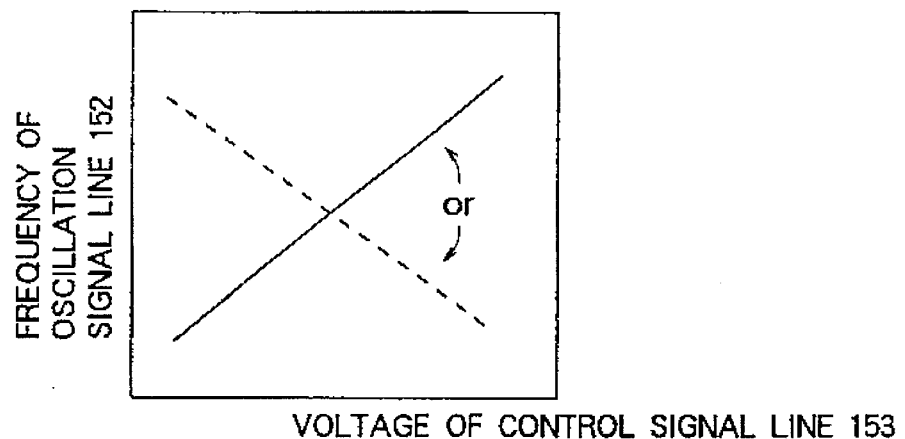
FIG. 9 is a plot showing the relationship between the voltage of the control signal line 153 in the oscillation circuit 103 and the frequency of the oscillation signal transfer line 152.

As shown in FIG. 9 by the solid line, in this oscillation circuit 103, if the voltage of the control signal of the control signal line 153 is increased, the frequency of the oscillation signal of the oscillation signal transfer line 152 is proportionally increased. Regarding this relationship between the voltage of the control signal and the frequency of the oscillation signal, the oscillation circuit 103 is not limited to the circuit providing proportional increase of the frequency of the oscillation signal according to the increase of the voltage of the control signal as shown in the above embodiment, but also can be designed so as to reduce the frequency of the oscillation signal according to the increase of the voltage of the control signal as shown in FIG. 9 by the dotted line.

Figure 4:
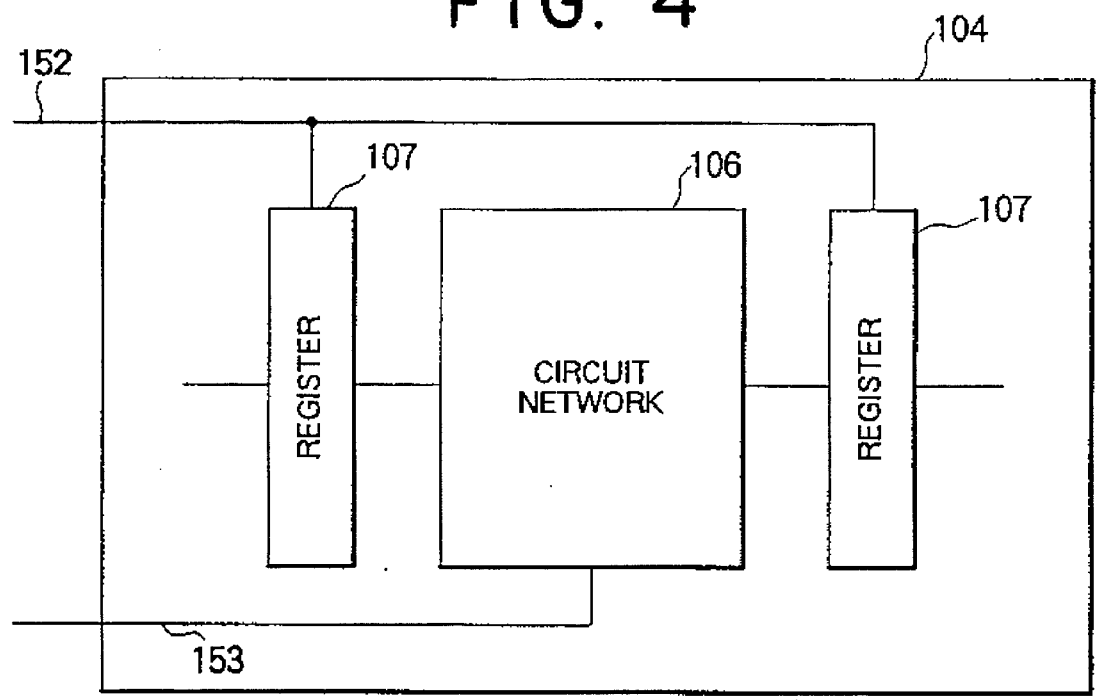
FIG. 4 is a block diagram showing one example of a synchronized circuit network 104 in the first embodiment.

FIG. 4 is a block diagram showing the synchronized circuit network 104. The synchronized circuit network 104 comprises registers 107 operating synchronously by the oscillation signal of the oscillation signal transfer line 152 and circuit networks 106 constructed by basic gate circuits 105 capable of controlling the delay time by the control signal of the control signal line 153. The synchronized circuit network 104 contains multiple registers 107 and multiple circuit networks 106.

Figure 5:
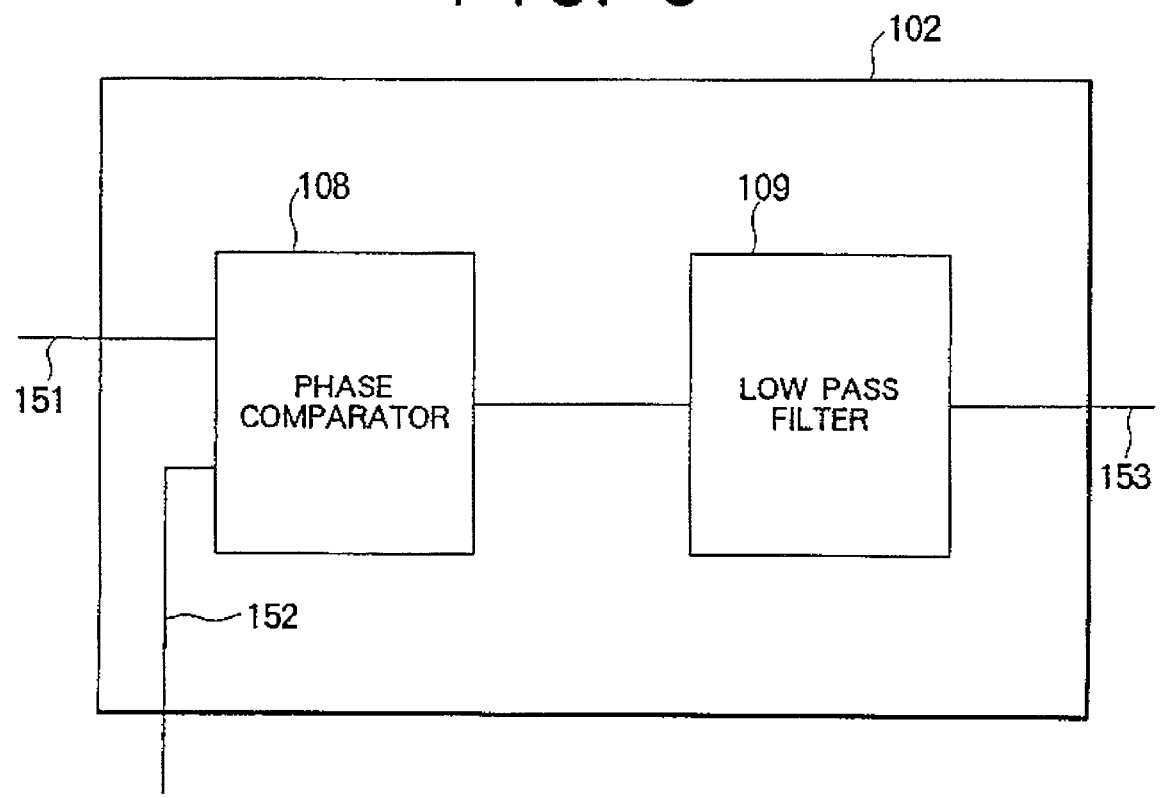
FIG. 5 is a block diagram showing one example of a control circuit 102 in the first embodiment.

FIG. 5 is a block diagram showing the control circuit 102. The control circuit 102 comprises a phase comparator 108 to compare the phase difference between the signal of the externally input signal line 151 and the signal of the oscillation signal transfer line 152 and a low pass filter 109 to eliminate high-frequency components from the output signal of the phase comparator 108. The phase comparator 108 may be constructed with a gate circuit realizing the exclusive OR, for example. The construction of control circuit 102 shown in FIG. 4 is exemplary, and therefore, the present invention is not limited to this control circuit, but various constructions can be used.

This is, in the control circuit 102 the phase difference between the signal input from the externally input signal line 151 and the signal input from the oscillation signal transfer line 152 can be compared by the phase comparator 108 and then the signal to reduce the delay time of the basic gate circuits 105 is output to the control signal line 153 if the time of the former is advanced (e.g., fast) in one hand and the signal to increase the delay time of the basic gate circuits 105 is output to the control signal line 153 if the time of the former is delayed (e.g., slow).

Figure 10:
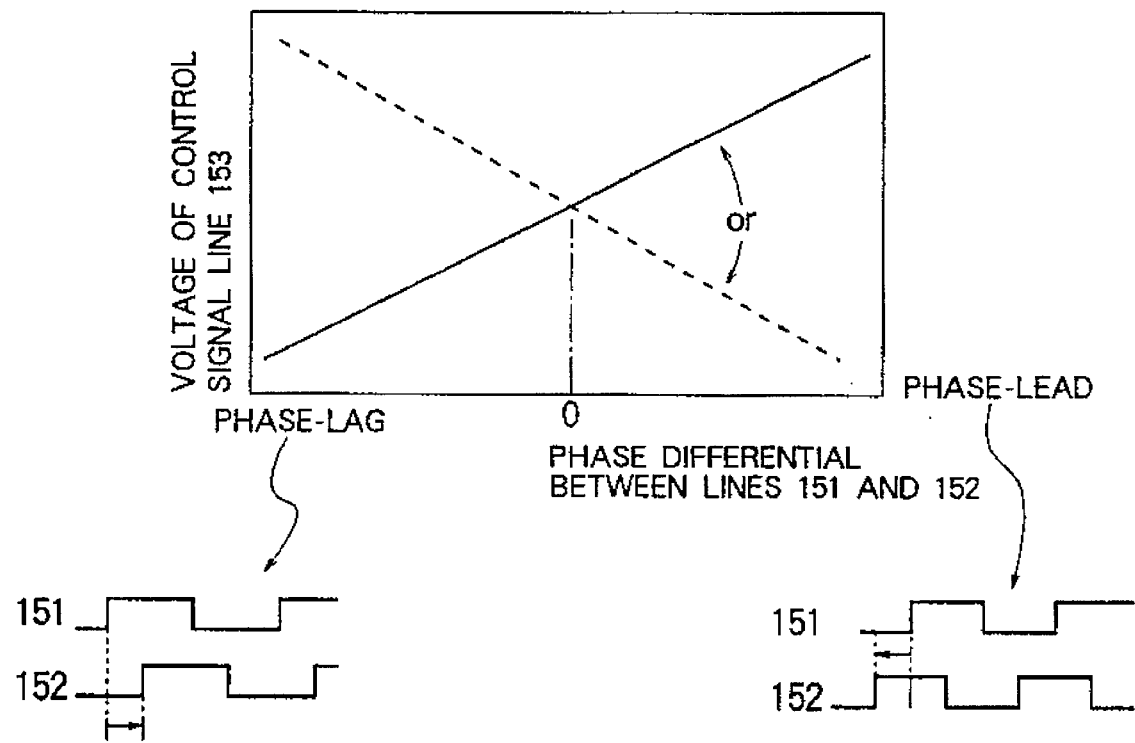
FIG. 10 is a plot showing the relationship between the phase differential between the externally input signal line 151 and the oscillation signal transfer line 152 in the control circuit 102 and the voltage of the control signal line 153.

FIG. 10 is a graph showing the relationship between the phase differential between the input signal from the externally input signal line 151 and the oscillation signal from the oscillation signal transfer line 152 plotted on the x-axis and the voltage of the control signal output to the control signal line 153 plotted on the y-axis. The mid-point of the x-axis represents the zero point of the phase differential. If phase-lag occurs, the data point shifts to the left side on the x-axis of the zero point. While, if phase-lead occurs, the data point shifts to right side on the x-axis of the zero point. The waveforms for phase-lag and phase-lead are shown in FIG. 10. As shown in FIG. 10 by the solid line, the voltage of the control signal output to the control signal line 153 is increased according to the increase of the phase-lead. In this control circuit 102, the relationship between the phase differential and the voltage of the control signal also can be designed so that the voltage of the control signal is decreased according to the increase of the phase-lead, as shown in FIG. 10 by the dotted line.

Figure 6:
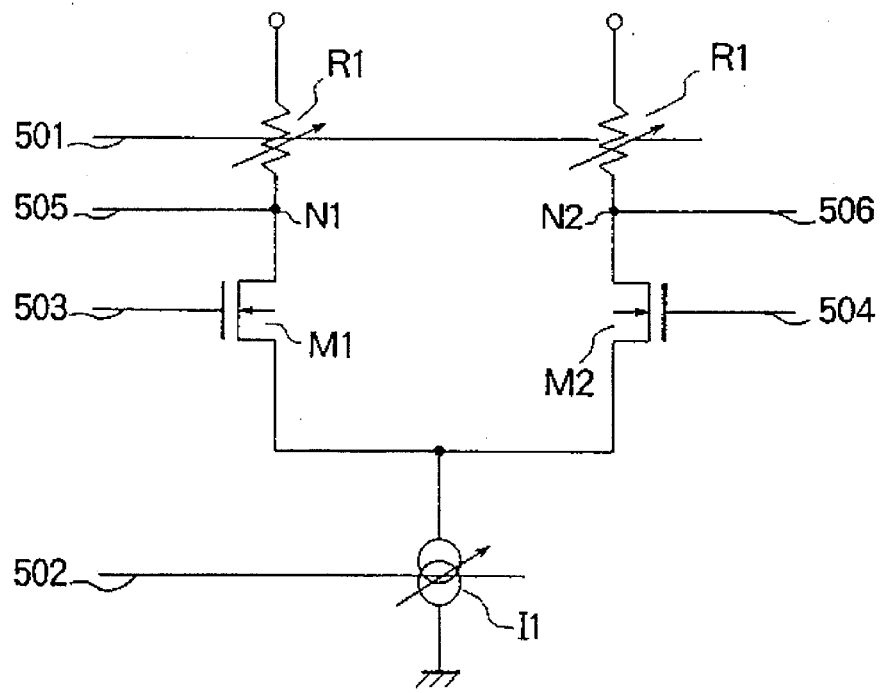
FIG. 6 is a circuit diagram showing one example of a buffer/inverter circuit of a basic gate circuit capable of controlling the delay time in the first embodiment.
Figure 7:
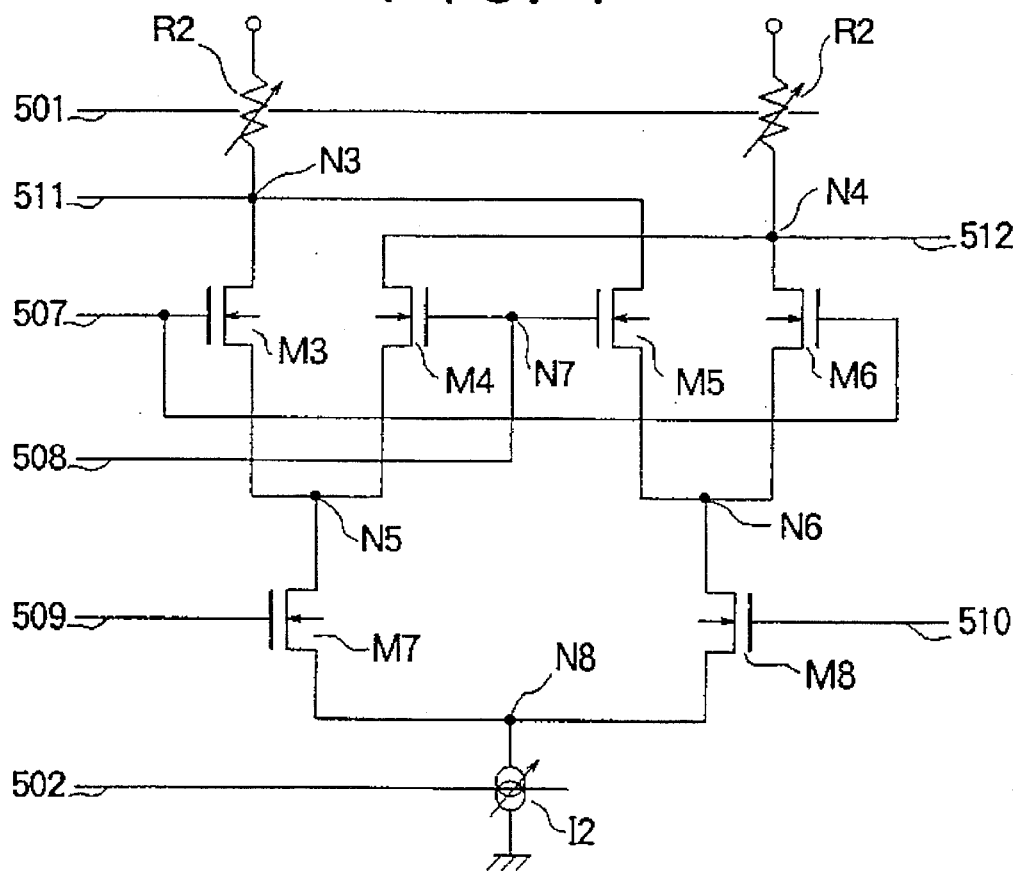
FIG. 7 is a circuit diagram showing one example of an EXNOR/EXOR circuit of a basic gate circuit capable of controlling the delay time in the first embodiment.

FIGS. 6 and 7 are circuit diagrams showing examples of the basic gate circuit 105. The basic gate circuit shown in FIG. 6 functions as a buffer or an inverter, and the basic gate circuit shown in FIG. 7 functions as EXNOR or EXOR.

In the basic gate circuit shown in FIG. 6, a pair of variable resistor R1 is connected to a high voltage current source (the first current source voltage) and a constant current source I1 is connected to the earth (the second current source voltage). Between this constant current source I1 and each variable resistor R1, nMOS transistors M1 and M2 are connected. The resistance value of variable resistors R1 can be changed by the control signal line 501. The current of constant current source I1 can be changed by the control signal line 502. To each gate of the transistors M1 and M2, each of input signal lines 503 and 504 for the basic gate circuit is connected. Output signal lines 505 and 506 are connected to nodes N1 and N2 between variable resistors R1 and the transistors M1 and M2, respectively.

In the basic gate circuit shown in FIG. 7, a pair of variable resistors R2 are connected to a high-voltage current source and drains of nMOS transistors M3 and M6 are connected to the variable resistors R2 through nodes N3 and N4, respectively. Each source of the transistors M3 and M6 is connected to each drain of nMOS transistors M7 and M8 through each of nodes N5 and N6. Each source of the transistors M7 and M8 is connected to a constant current source I2 through a node N8 and the another end of the constant current source I2 is connected to the earth.

A drain and a source of a nMOS transistor M4 are connected to the nodes N4 and N5, respectively and a drain and a source of a nMOS transistor M5 are connected to the nodes N3 and N6, respectively. Each gate of the transistors M4 and M5 is connected each other through a node N7.

An input signal line 507 of the basic gate circuit is connected to each gate of the transistors M3 and M6 and an input signal line 508 is connected to each gate of the transistors M4 and M5 through the node N7. Input signal lines 509 and 510 of the basic gate circuit are connected to gates of the transistors M7 and M8, respectively. The control signal lines 501 and 502 controls the variable resistors R2 and the constant current source I2, respectively. Output signal lines 511 and 512 are connected to nodes N3 and N4 between variable resistors R2 and the transistors M3 and M6, respectively.

In the basic gate circuits shown in FIGS. 6 and 7, the resistance value of the variable resistors R1 and R2 can be changed by the control signal line 501 and the current of the constant current sources I1 and I2 can be changed by the control signal line 502. The transistors M1 to M8 synthesize the logic. Then, by input of the control signal through the control signal lines 501 and 502, the delay time of this basic gate circuit can be controlled.

That is, in case the delay time of the basic gate circuit is to be increased, the resistance values of the variable resistors R1 and R2 is increased by said control signal and the current of the constant current sources I1 and I2 is reduced. On the other hand, in case the delay time of the basic gate circuit is to be reduced, the resistance value of the variable resistors R1 and R2 is reduced and the current of the constant current sources I1 and I2 is increased. Thus, by changing the resistance value and the currents at the same time, this basic gate circuit can change the current of constant current source defining the driving current, keeping the signal amplitude at the constant.

Figure 11:
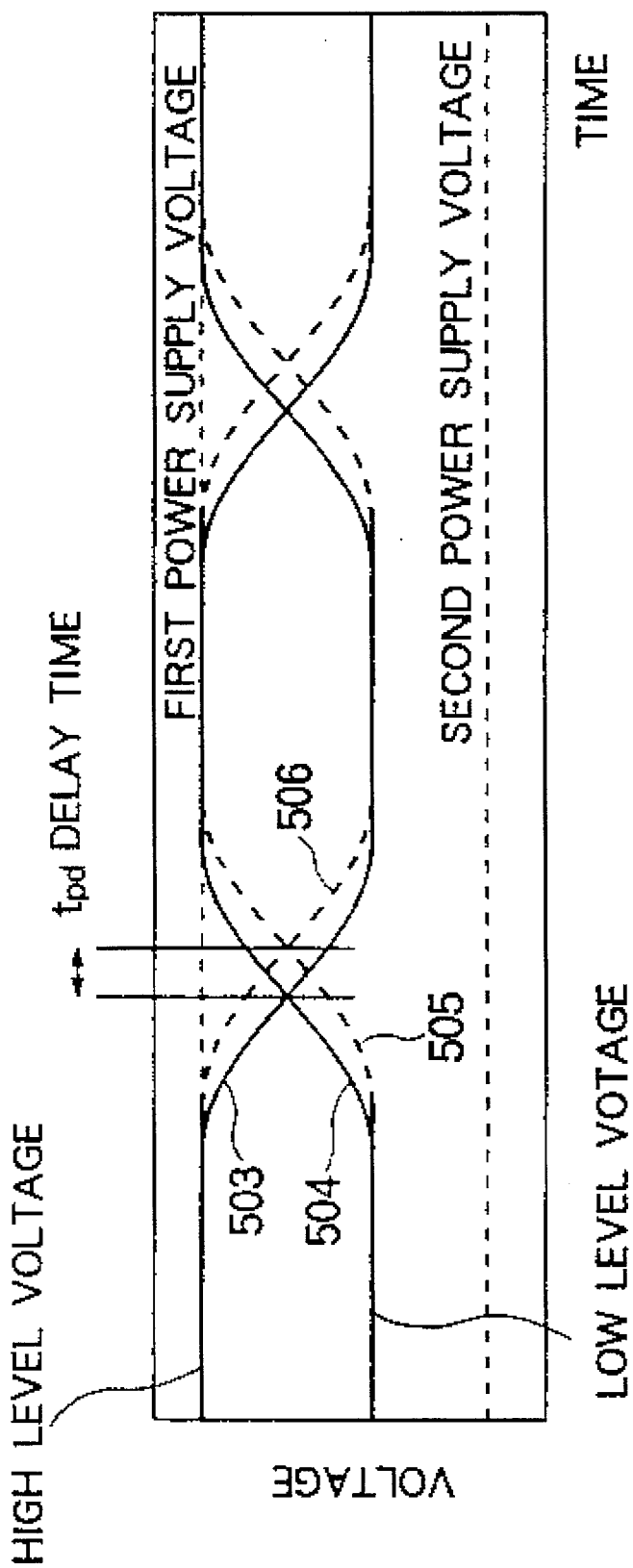
FIG. 11 is a timing chart showing the changes of the signals in the basic gate circuit shown in FIG. 6.

FIG. 11 is a timing chart showing the change of voltage of each signal line in the basic gate circuits shown in FIG. 6. That is, the input signals of the basic gate circuits are input to gates of the transistors M1 and M2 through the input signal lines 503 and 504, respectively. If these input signals change as shown in FIG. 11 by the solid line, output signals of the output signal lines 505 and 506, connected to the nodes N1 and N2, respectively, also change with the delay time tpd, as shown in FIG. 11 by the dotted line. There is a differential in the signals between the signal lines 503 and 504. There is also a differential in the signals between the signal lines 505 and 506. That is when the signals of the signal lines 503 and 506 are at high level, the signals of the signal lines 504 and 505 are at low level.

In this case, the low level voltage of each signal can be expressed as (high level voltage)−(resistance value of the variable resistor R1)×(constant current of the constant current source I1). The delay time tpd can be increased by increasing the resistance value of the variable resistor R1. In this case, in order to maintain the amplitude of signal at constant by keeping the low level voltage at constant, the constant current of the constant current source I1 must be decreased when the resistance value of the variable resistor R1 is increased as indicated by the above formula. On the contrary, when the resistance value of the variable resistor R1 is decreased, the constant current of the constant current source I1 must be increased.

Thus, by changing simultaneously the resistor value of the variable resistance R1 and the constant current of the constant current source I1, the delay time can be controlled, maintaining the amplitude of signals from the output signal lines 505 and 506.

The basic gate circuits shown in FIG. 7 operate in the same way as described for the basic gate circuits shown in FIG. 6. In the basic gate circuits shown in FIG. 7, the signals of input signal lines 507 and 508 or the input signal lines 509 and 510 change with a differential between each other, and the signals of the output signal lines 511 and 512 also change with a differential. The signal of the output signal line 511 is at low level only when both input signal lines 507 and 509 are at high level or when both input signal lines 507 and 509 are at low level.

The signal of the output signal line 511 is at high level only when the input signal line 507 is at high level and the input signal line 509 is at low level, or when the input signal line 507 is at low level and the input signal line 509 is at high level.

Further, the basic gate circuits used in the present invention may be of any construction if the delay time can be controlled externally by at least one signal line as described above. That is, the constructions of the basic gate circuits 105 shown in FIGS. 6 and 7 are examples, but not for restricting claims of the present invention.

Figure 8:
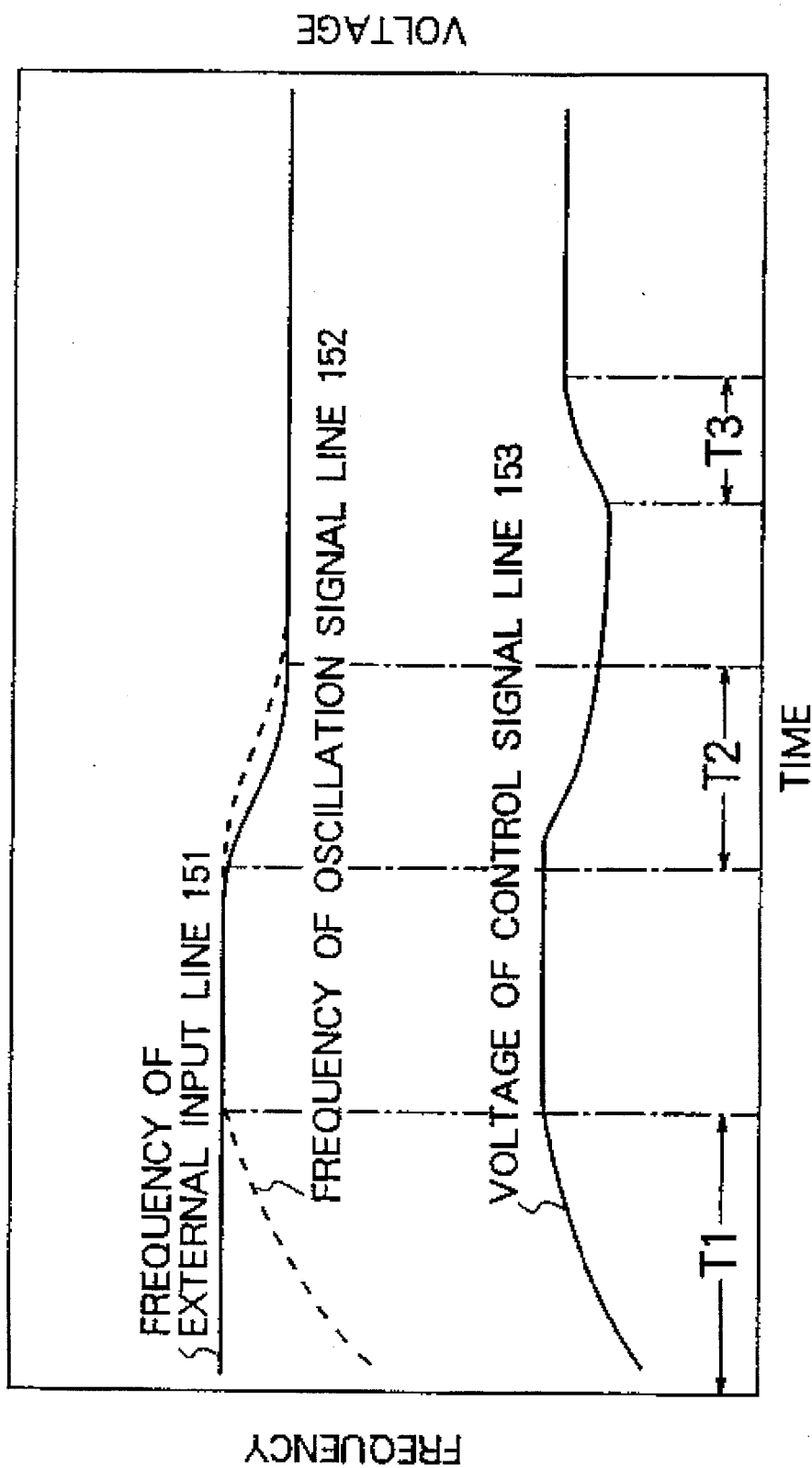
FIG. 8 is a timing chart showing the change patterns of the frequency of the externally input signal line 151 and the oscillation signal transfer line 152 and the voltage of the control signal line 153.

Next, the operation of this embodiment will be described. FIG. 8 is a timing chart illustrating the operation of the semiconductor integrated circuit 101 according to the embodiment shown in FIG. 2. In FIG. 8, the relationship between the frequency of the input signal and the oscillation signal and the voltage of the control signal is shown, taking time on the x-axis and the frequency of the input signal of the externally input signal line 151, the frequency of the oscillation signal of the oscillation signal transfer line 152 or the voltage of the control signal of the control signal line 153 on y-axis. At T1 immediately after the system was switched on, the control signal of the control signal line 153 is changed so that the frequency of the oscillation signal of the oscillation signal transfer line 152 is equalized to the frequency of the externally input signal of the externally input signal line 151. Normally, the operation of the system is not assured during this period T1. Therefore, the system must be reset or interrupted by such means as holding.

Then, if the frequency of the externally input signal of the externally input signal line 151 is changed during the period T2, the voltage of the control signal of the control signal line 153 also changes so that the frequency of the oscillation signal of the oscillation signal transfer line 152 follows such change of the frequency of the externally input signal.

On the other hand, even though the frequency of the oscillation signal of the oscillation signal transfer line 152 is to change according to the change of the delay time of the basic gate circuits due to the change of operation environment characteristics such as temperature, source voltage and the like, the voltage of the control signal of the control signal line 153 changes so as to maintain the delay time of the basic gate circuits at constant as shown for the period T3 in FIG. 8. Therefore, the frequency of the oscillation signal of the oscillation signal transfer line 152 is kept at constant.

Thus, because the synchronized circuit network 104 is operated synchronously be the operation frequency of the oscillation circuit 103 constructed using the basic gate circuits having the number of stages proportional to the number of gates existing at the critical path of the synchronized circuit network 104, the synchronized circuit network 104 can be always operated at the frequency obtained from the oscillation signal transfer line 152 even if the delay time of the basic gate circuits is changed by variations of the device characteristics due to variations of the threshold value, the gate length and the like of the transistors as well as variations in specification such as the resistance value and the capacitance value of the wiring and the like and changes of operating environments such as temperature, current source voltage and the like.

Further, the delay time of the basic gate is controlled so that the synchronized circuit network 104 is operated at the frequency obtained from the externally input line 151 by the control circuit 102, the semiconductor integrated circuit 101 can be always operated at the frequency obtained from the externally input signal line 151 even though there are variations of the device characteristics due to variations of the threshold value, the gate length and the like of the transistors as well as variations in specification such as the resistance value and the capacitance value of the wiring and the like and changes of operating environments such as temperature, current source voltage and the like.

Then referring to FIG. 12 the integrated digital circuit according to the second embodiment of the present invention will be described.

The semiconductor integrated digital circuit 101 according to this embodiment comprises a simulator (e.g., replica) delay circuit 110 including basic gate circuits having the number of stages proportional to the number of gates existing at the critical path of a synchronized circuit network 104 and capable of controlling the delay time by at least one control signal line 153. The synchronized circuit network 104 comprises basic gate circuits capable of controlling the delay time by at least one control signal line 153 and operating synchronously by an oscillation signal transfer line 152. A control circuit 102 controls the simulator delay circuit 110 and the synchronized circuit network 104 through the control signal line 153 so as to equalize the frequency of the signal input from an externally input signal line 151 to the frequency of signal of the oscillation signal transfer line 152.

Figure 13:
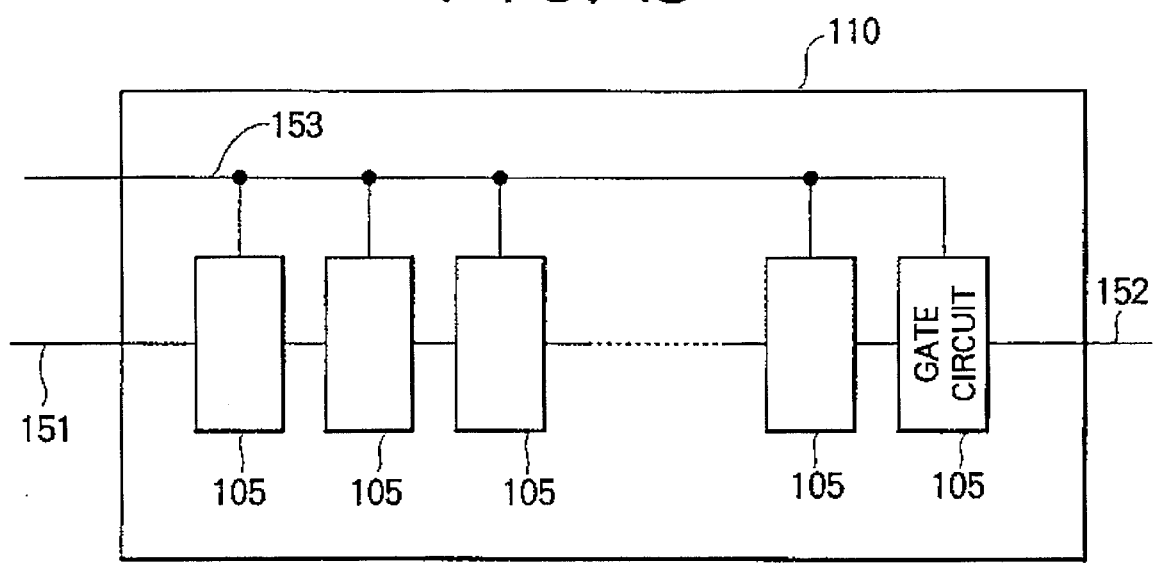
FIG. 13 is a block diagram showing the construction of a simulator delay time circuit 110 in the second embodiment.

FIG. 13 is a block diagram showing the simulator delay circuit 110. The simulator (e.g., replica) delay circuit 110 includes basic gate circuits 105 connected in a line and comprising the number of gates proportional to the number of gates at the critical path of the synchronized circuit network 104. The delay time of the basic gate circuits 105 can be controlled by the control signal line 153. The signal input from the externally input line 151 is output to the oscillation signal transfer line 152 after the delay time controlled by the control signal of the control signal line 153.

Figure 14:
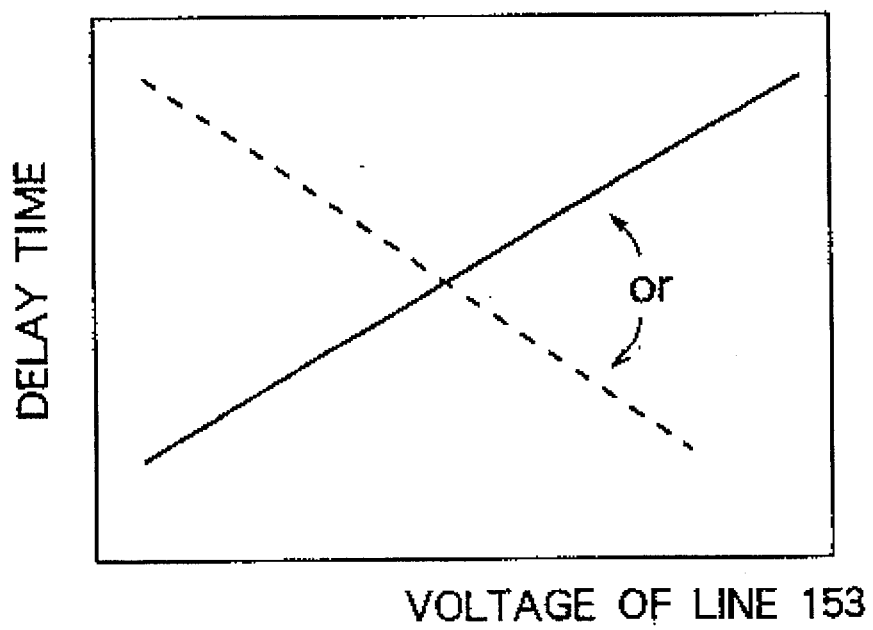
FIG. 14 is a plot showing the relationship between the voltage of the control signal line 153 of simulator delay circuit 110 shown in FIG. 13 and the time from input of the input signal from the externally input signal line 151 to output of the oscillation signal to the oscillation signal transfer line 152.

FIG. 14 is a graph showing the relationship between the voltage of the control signal of the control signal line 153 and the delay time in this simulator delay circuit 110 from the time the externally input signal was input to the externally input signal line 151 to the time the oscillation signal is output to the oscillation signal transfer line 152. The relationship between the voltage of the control signal and the delay time of this embodiment is shown in FIG. 14 by the solid line. Thus, the delay time is increased according to the increase of the voltage of the control signal and the delay time of the basic gate circuit is controlled by the control signal.

The construction of the synchronized circuit network 104, a control circuit 102 and a basic gate circuit 105 is the same as those of the first embodiment shown in FIGS. 4, 5, 6 and 7, respectively.

Figure 12:
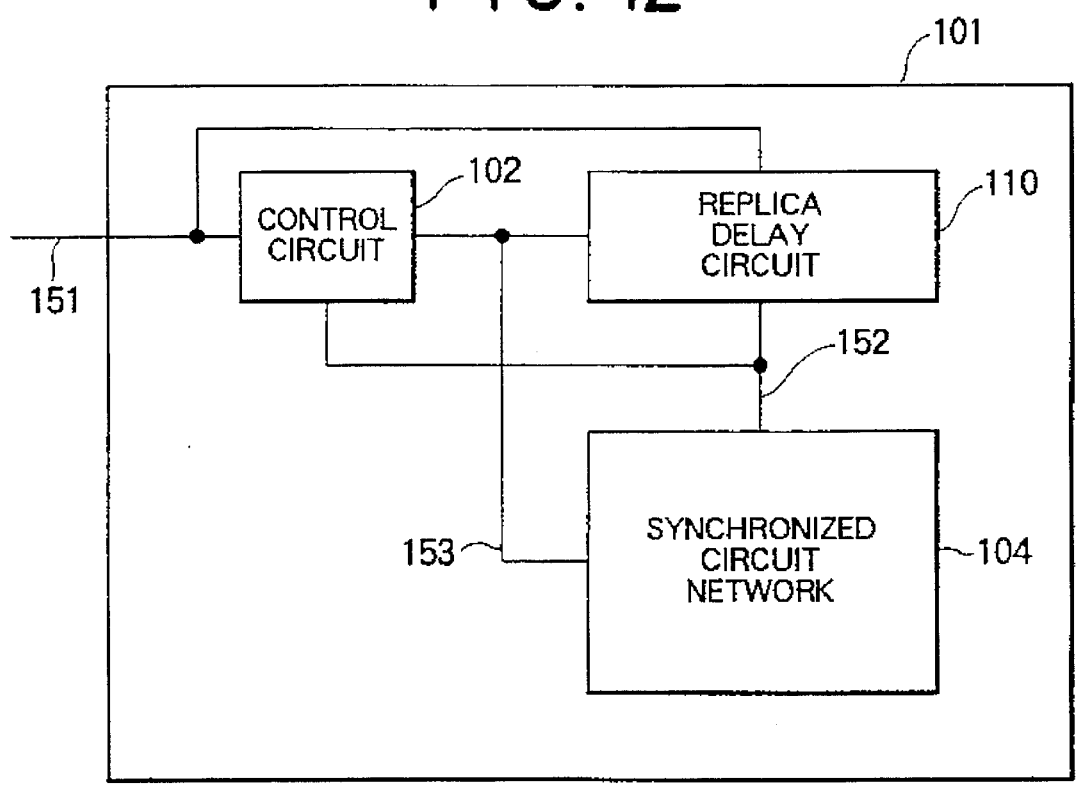
FIG. 12 is a block diagram showing the construction of an integrated digital circuit 101 according to the second embodiment of the present invention.

Referring to FIG. 12, the control circuit 102 controls the delay time of both the simulator delay circuit 110 and the synchronized circuit network 104 so that the delay time of the simulator delay circuit 110 constructed using the basic gate circuits having the number of stages proportional to the number of gates existing at the critical path of the synchronized circuit network 104 is equalized to the frequency time of the synchronized signal input from the externally input signal line 151. Therefore, the synchronized circuit network 104 can be always operated at the frequency obtained from the externally input signal line 151 even if the delay time of the basic gate circuits is changed by variations of the device characteristics due to variations of the threshold value, the gate length and the like of the transistors as well as variations in specification such as the resistance value and the capacitance value of the wiring and the like and changes of operating environments such as temperature, current source voltage and the like.

Then referring to FIG. 15, the integrated digital circuit according to the third embodiment of the present invention will be described. The semiconductor integrated digital circuit 101 according to this embodiment comprises an oscillation circuit 103 including basic gate circuits having the number of stages proportional to the number of gates existing at the critical path of a synchronized circuit network 104 and capable of controlling the delay time by at least one control signal line 153. The synchronized circuit network 104 comprises basic gate circuits capable of controlling the delay time by at least one control signal line 153 and operating synchronously by an oscillation signal transfer line 154. A control circuit 102 controls the oscillation circuit 103 and the synchronized circuit network 104 through the control signal line 153 so as to equalize the frequency of signal the input from an externally input signal line 151 to the frequency of the oscillation signal of the oscillation signal transfer line 155. A divider 111 divides the frequency of the signal from the oscillation signal transfer line 154 into a desired dividing ratio.

The construction of an oscillation circuit 103, a synchronized circuit network 104, a control circuit 102 and a basic gate circuit 105 is the same as those of the first embodiment shown in FIGS. 3, 4, 5, 6 and 7, respectively.

Figure 15:
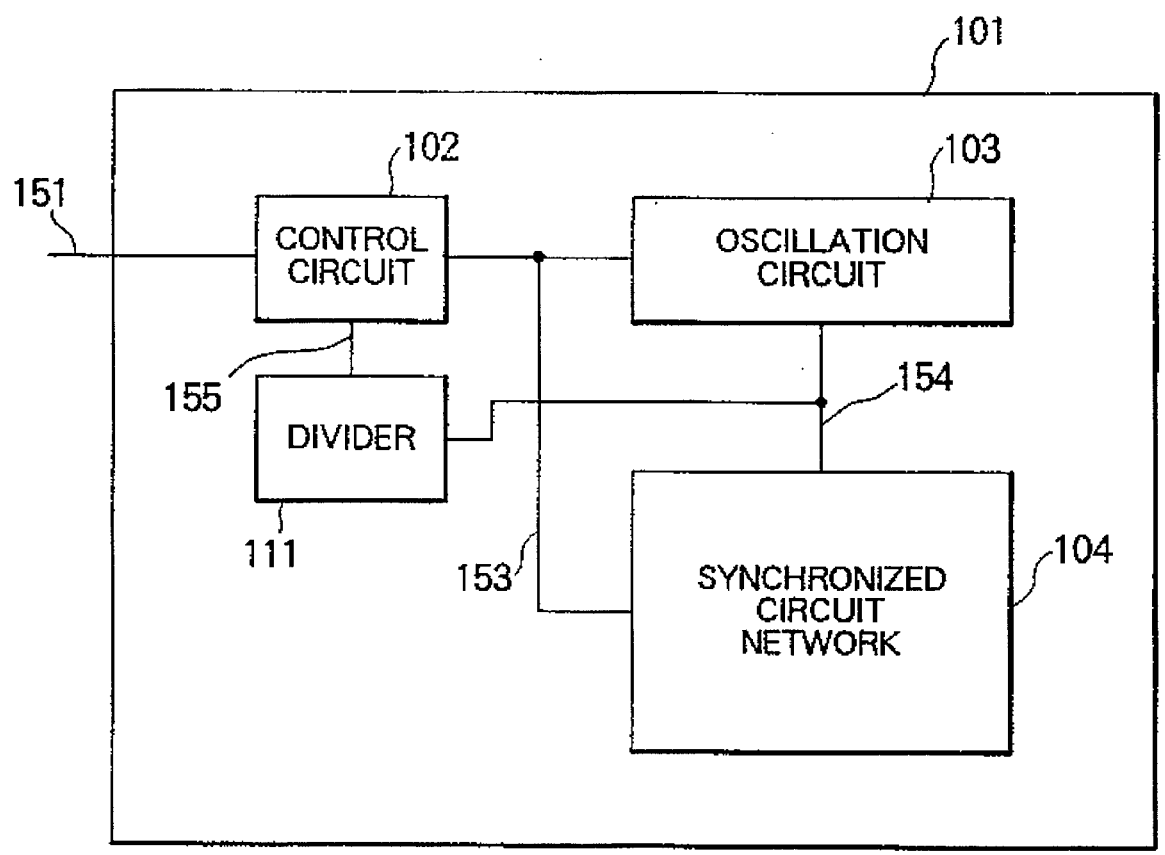
FIG. 15 is a block diagram showing an integrated digital circuit 101 according to the third embodiment of the present invention.

Referring to FIG. 15, because the synchronized circuit network 104 is operated synchronously by the operating frequency of the oscillation circuit 103 constructed using the basic gate circuits having the number of stages proportional to the number of gates existing at the critical path, the synchronized circuit network 104 can be always operated at the frequency obtained from the oscillation signal transfer line 154 even if the delay time of the basic gate circuits is changed by variations of the device characteristics due to variations of the threshold value, the gate length and the like of the transistors forming the semiconductor integrated circuit 101 as well as variations in specification such as the resistance value and the capacitance value of the wiring and the like and changes of operating environments such as temperature, current source voltage and the like.

Further, because the dividing circuit 111 divides the signal of the oscillation signal transfer line 154 and then the control circuit 102 equalizes the frequency of the divided signal to the frequency of the signal of the externally input signal line 151, the semiconductor integrated circuit 101 can be always operated synchronously with the signal obtained from the externally input signal line 151 even if there are variations of the device characteristics due to variations of the threshold value, the gate length and the like of the transistors as well as variations in specification such as the resistance value and the capacitance value of the wiring and the like and changes of operating environments such as temperature, current source voltage and the like.

According to this embodiment, because the dividing circuit 111 divides the oscillation signal from the oscillation circuit 103, the signal input from the externally input signal line 151 has lower frequency than the operating frequency of the synchronized circuit network 104.

As a result, the frequency of the signal input to the semiconductor integrated circuit 101 becomes lower than the internal operating frequency. Therefore, designing of the input/output circuit exchanges between the internal and external of the semiconductor integrated circuit 101 becomes easier and the power consumed at the input/output circuit also can be reduced.

Figure 16:
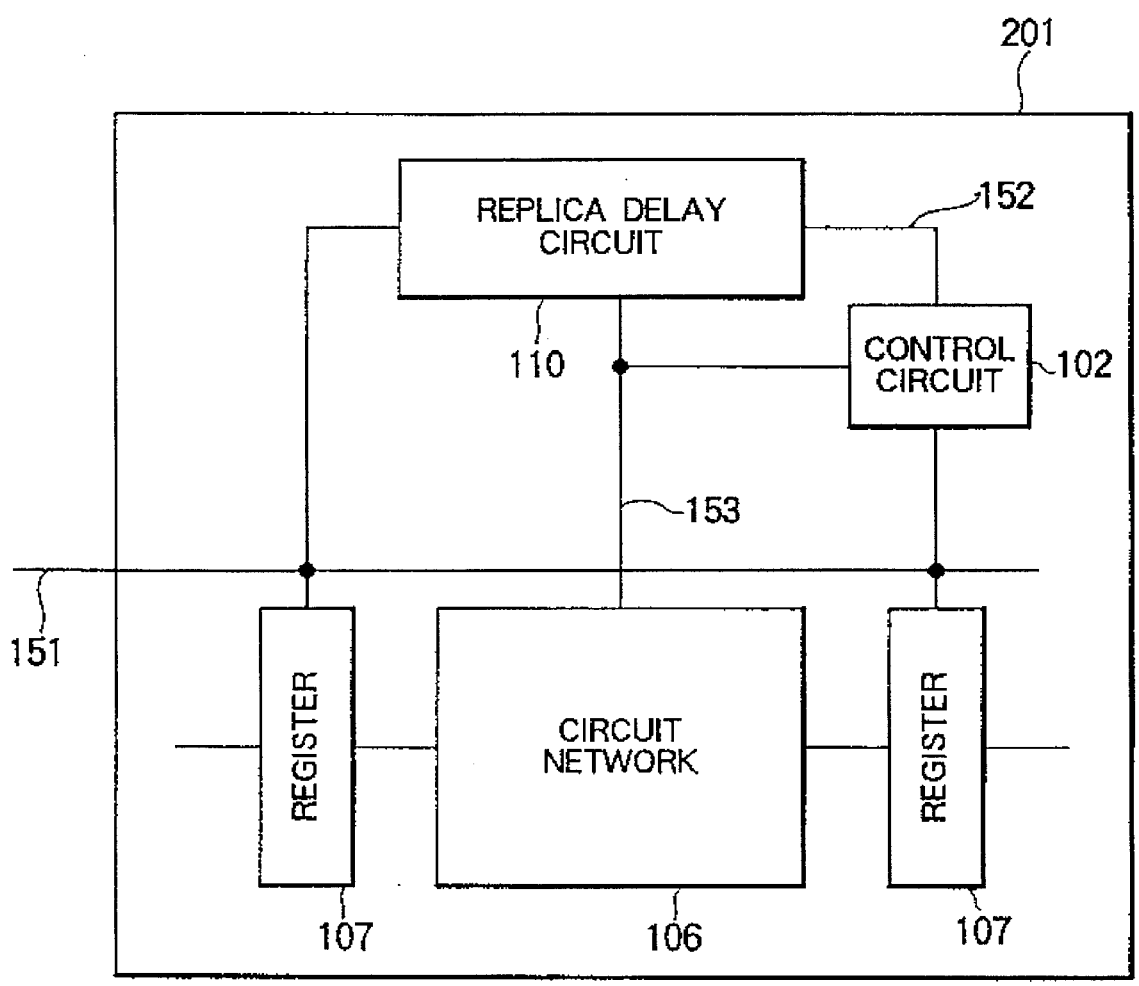
FIG. 16 is a block diagram showing a synchronized circuit network 201 in an integrated digital circuit according to the fourth embodiment of the present invention.

FIG. 16 is a block diagram showing an integrated digital circuit according to the fourth embodiment of the present invention. A synchronized circuit network 201 representing the integrated digital circuit according to this embodiment has at least two registers 107 operating synchronously with the externally input signal line 151. A circuit network 106 comprises basic gate circuits connected between said registers 107, constructing a logic circuit or a memory circuit and capable of controlling the delay time by at least one control signal of the control signal 153. A simulator (e.g., replica) delay circuit 110 comprises basic gate circuits constructed with the number of stages proportional to the number of gates existing at the critical path of the circuit network 106 so as to input the signal from the externally input signal line 151 and output the signal to an oscillation signal transfer line 152. A control circuit 102 controls the control signal of the control signal line 153 so that the delay time of the simulator delay circuit network 110 is coincided with the cycle time of the periodic signal from the externally input signal line 151.

The construction of a simulator delay circuit 110 and a control circuit 102 is the same as those of the aforementioned embodiment shown in FIGS. 13 and 5, respectively.

The construction of basic gate circuits capable of controlling the delay time, used in the simulator delay circuit 110 and the circuit network 106 was already described in the former embodiment.

Referring to FIG. 16, because the control circuit 102 controls the delay time of the basic gate circuits capable of controlling the delay time of the circuit network 106 and the simulator delay circuit 110 so that the delay time of the simulator delay circuit 110 constructed using the basic gate circuits having the number of stages proportional to the number of gates existing at the critical path is coincided with the cycle time of the periodic signal from the externally input signal line 151, the circuit network 106 can be always operated at the frequency obtained from the externally input signal line 151 even if the delay time of the basic gate circuits is changed by variations of the device characteristics due to variations of the threshold value, the gate length and the like of the transistors forming the synchronized circuit network 201 as well as variations in specification such as the resistance value and the capacitance value of the wiring and the like and changes of operating environments such as temperature, current source voltage and the like.

According to the above-described second embodiment, one simulator delay circuit was constructed using the critical path most critical in the circuit network connected between at least two registers existing in the synchronized circuit network constructing the integrated digital circuit and the synchronized signal was generated at least two registers constructing the synchronized circuit network from the simulator delay circuit thereof and the externally input signal line. However, the simulator delay circuit and the control circuit were prepared using the critical path of the circuit network for each or multiple circuit networks connected between at least two registers existing in the synchronized circuit network constructing the integrated digital circuit in this fourth embodiment. Therefore, in this fourth embodiment, one integrated digital circuit has multiple simulator delay circuits and control circuits.

In case of construction of the synchronized circuit according to the prior art, the circuit network was constructed and the insertion position of the registers was determined so as to make the critical delay time of the circuit network between registers uniform, however freedom for insertion position of registers is increased according to the fourth embodiment of the present invention because the delay time of each circuit network is controlled so as to coincide with the cycle time of the periodic signal of the externally input signal without making the delay time of registers uniform.

Figure 17:
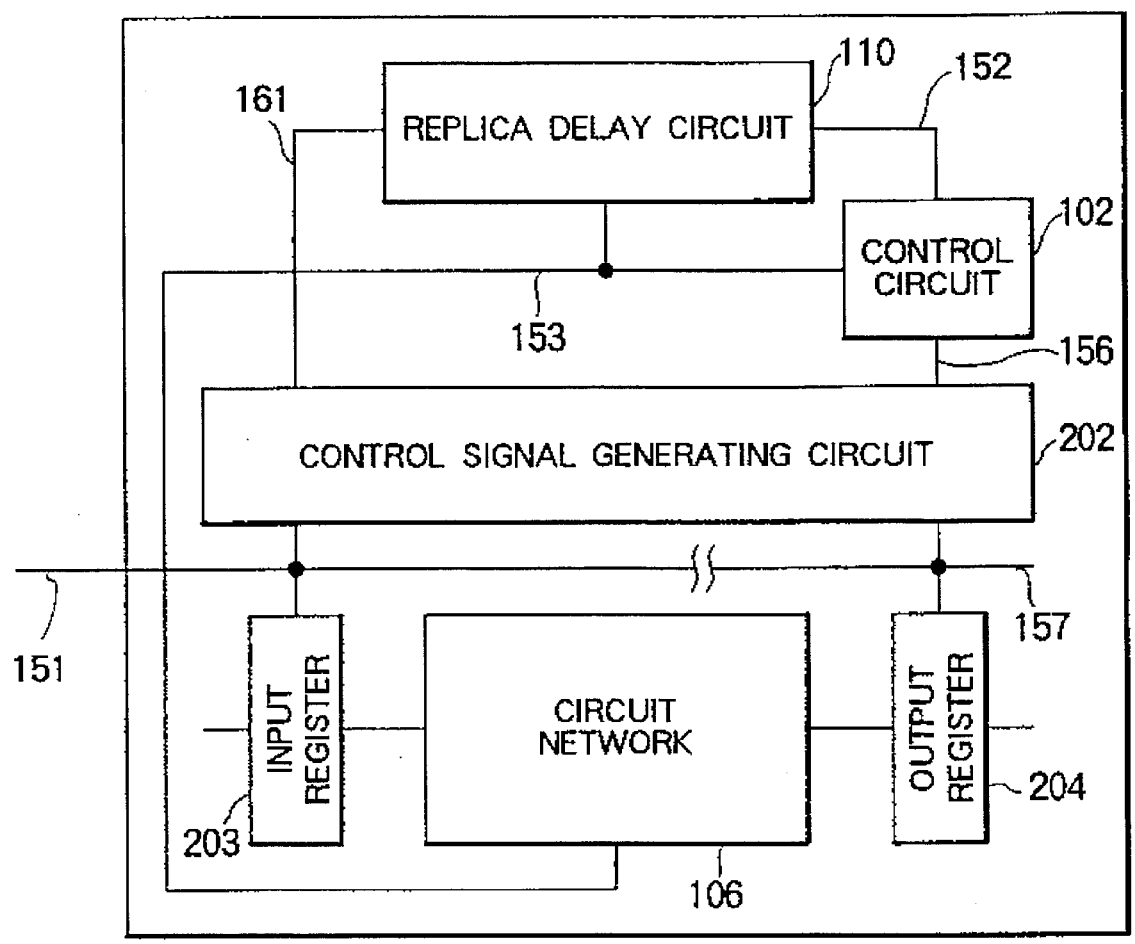
FIG. 17 is a block diagram showing a synchronized circuit network 201 in an integrated digital circuit according to the fifth embodiment of the present invention.

FIG. 17 is a block diagram showing an integrated digital circuit according to the fifth embodiment of the present invention. Referring to FIG. 17, a synchronized circuit network 201 representing the integrated digital circuit according to this embodiment has at least two registers, that is, an input register 203 connected to an externally input line 151 and an output register 204 connected to another externally input line 157 as shown in FIG. 17. Those registers 203 and 204 are capable of operating synchronously with the externally input signal line. A circuit network 106 constructed with basic gate circuits is connected between the registers. The circuit network 106 constructing a logic circuit or a memory circuit is capable of controlling the delay time by at least one control signal line 153. A control signal generating circuit 202 generates the input signal of a simulator delay circuit 110 and a control circuit 102 from the externally input lines 151 and 157, a simulator delay circuit 110, inputting the signal from a pseudo-externally input line 161 and outputting a signal to an oscillation signal transfer line 152. The simulator delay circuit 110 comprises basic gate circuits having the number of stages proportional to the number of gates existing at the critical path of the circuit network 106 and capable of controlling the delay time. A control circuit 102 controls the delay time of the basic gate circuits in the circuit network 106 and the simulator delay circuit 110 by the circuit network 106 using an externally input signal line 156 and the oscillation signal transfer line 152 so that the input register 203 and the output register 204 are operated synchronously by the externally input signal lines 151 and 157, respectively. Reference numerals 156, 157 and 161 denote pseudo-externally input signal lines.

The construction of a simulator delay circuit 110 is the same as that of the aforementioned embodiment shown in FIG. 9. The construction of basic gate circuits capable of controlling the delay time, used in the simulator delay circuit 110 and the circuit network 106, was already described in the former embodiment.

The fourth embodiment was designed without consideration of the skew existing in the synchronized signals between the input register and the output register of the circuit network 106, while the fifth embodiment was designed based on consideration of skew existing in the synchronized signals between the input register and the output register so as to distinguish each synchronized signal as the externally input signal lines 151 and 157, respectively. Therefore, if the control signal generating circuit 202 was eliminated and the externally input signal line 151 was connected directly to a pseudo-external input signal line 161 and the externally input signal line 157 to a pseudo-external input signal line 156, the alignment of the fifth embodiment becomes the same as that of the fourth embodiment.

Figure 18:
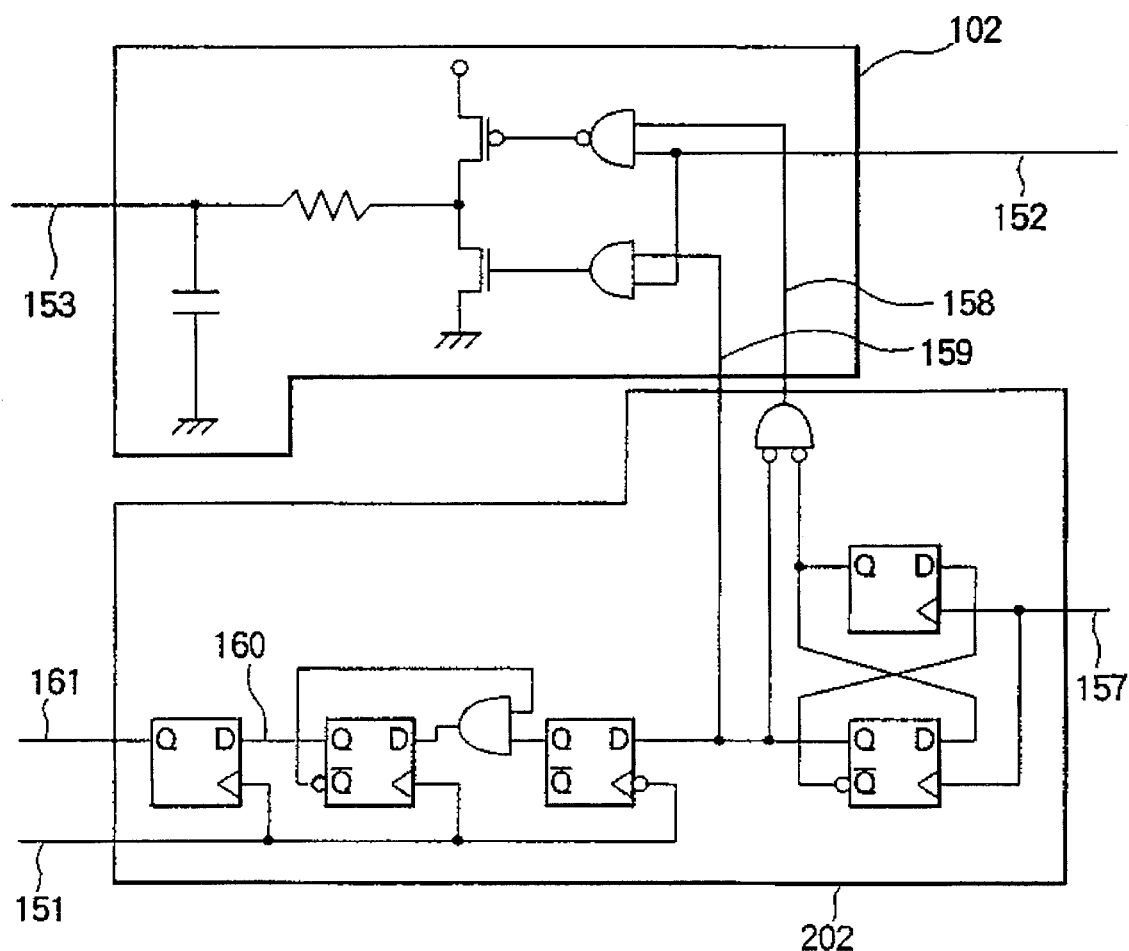
FIG. 18 is a circuit diagram showing a control circuit 102 and a control signal generating circuit 202 in the fifth embodiment of the present invention.

FIG. 18 is a circuit diagram showing the construction of the control circuit 102 and the control circuit signal generating circuit 202. It should be noted that the construction of the control circuit 102 and the control circuit signal generating circuit 202 shown in FIG. 13 is one example and not intended to restrict the range of claims of the present invention. Reference numerals 158, 159, 160 and 161 denote pseudo-externally input signal lines.

Figure 19:
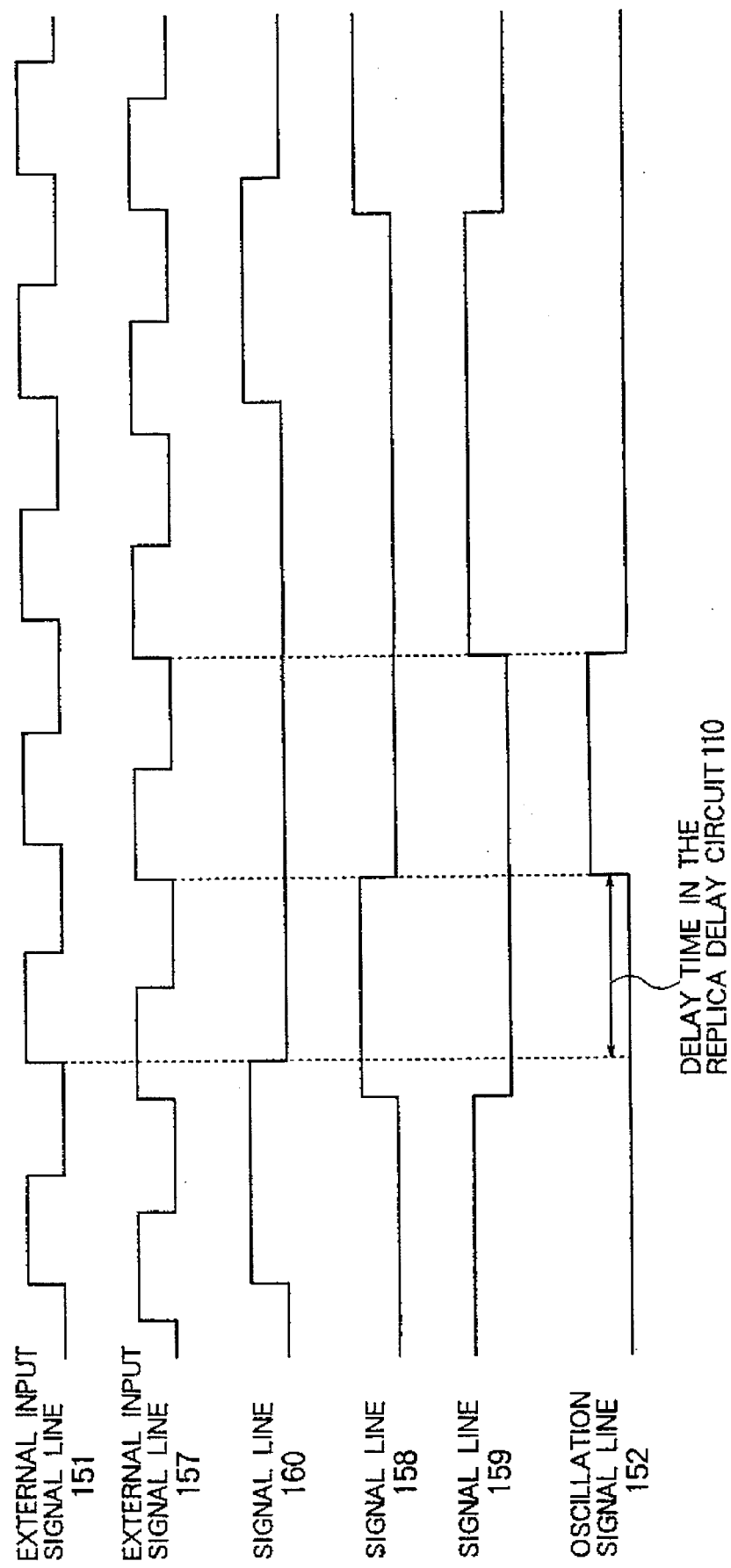
FIG. 19 is a timing chart of the control circuit and the control signal generating circuit in the fifth embodiment of the present invention.

FIG. 19 is a timing chart obtained when the control circuit 102 and the control circuit signal generating circuit 202 shown in FIG. 13 are used.

Referring to FIGS. 17, 18 and 19, the pseudo-externally input signal line 160 is synchronized with the externally input signal line 151 and signal lines 158 and 159 are synchronized with the externally input signal line 157. A simulator delay circuit 110 is constructed with the basic gate circuit having a number of stages proportional to the number of gates existing at the critical path of the circuit network 106 and capable of controlling the delay time. Since the oscillation signal transfer line 152 transfers the signal delayed by the simulator delay circuit 110 from the signal in the pseudo-external signal input signal line 161 after the signal line 160 was synchronously delayed by the externally input signal line 151, the control circuit 102 controls the delay time of the circuit network 106 and the simulator delay circuit 110 so that the high-level period of the oscillation signal transfer line 152 is coincided with the low-level period of the signal lines 158 and 159. Therefore, the circuit network 106 can be operated synchronously by the input register 203 synchronized with the externally input signal line 151 and the output register 204 synchronized with the externally input signal line 157.

Because existing of the high-level period for the signal line 158 and the oscillation signal transfer line 152 means that the delay time of the critical path of the circuit network 106 is shorter than the period allowing to perform the optimum synchronized operation, the control circuit 102 increases the potential of the control signal line, resulting in increase of the delay time of the basic gate circuits of the circuit network 106 and the simulator delay circuit 110. Meanwhile, because the high-level period for the signal line 159 and the oscillation signal transfer line 152 means that the delay time of the critical path of the circuit network 106 is longer than the period allowing to perform the optimum synchronized operation, the control circuit 102 decreases the potential of the control signal line, resulting in a decrease of the delay time of the basic gate circuit of the circuit network 106 and the simulator delay circuit 110. Now, the term that performance of optimum synchronized operation means that the delay time of the critical path of the circuit 106 coincides with the time period from the point the externally input signal line 151 reached the high level to the point the externally input signal line 157 reaches the high level, or the time period from the point the externally input signal line 157 reached the high level to the point the externally input signal line 151 reaches the high level, or the time period from the point the externally input signal line 151 reached the low level to the point the externally input signal line 157 reaches the low level, or the time period from the point the externally input signal line 157 reached the low level to the point the externally input signal lines 151 reaches the low level.

Therefore, even though the skew exists in the externally input signal line 151 and the externally input signal line 157, the delay time of the critical path of the circuit network 106 can be operated synchronously with the input register 203 synchronized by the externally input signal line 151 and with the output register 204 synchronized by the externally input signal line 157.

Further, the circuit 106 can be always operated synchronously at the frequency obtained by the externally input signal line, even though the delay time of the basic gate circuit varied by variations of the device characteristics due to variations of the threshold value, the gate length and the like of the transistors consisting the synchronized circuit network 201 as well as variations in specification such as the resistance value and the capacitance value of the wiring and the like and changes of operating environments such as temperature, current source voltage and the like.

According to the above-described second embodiment, one simulator delay circuit is constructed using the critical path most critical in the circuit network connected between at least two registers existing in the synchronized circuit network constructing the integrated digital circuit and the synchronized signal was generated by the at least two registers constructing the synchronized circuit network from the simulator delay circuit thereof and the externally input signal line.

However, the simulator delay circuit, the control circuit and the control signal generating circuit are prepared using the critical path of the circuit network for each circuit network connected between the at least two registers existing in the synchronized circuit network constructing the integrated digital circuit in this fifth embodiment. Therefore, in this fifth embodiment, one integrated digital circuit has multiple simulator delay circuits and control circuits.

In the synchronized circuit according to the prior art, the circuit network is constructed and the insertion position of the registers was determined so as to make the critical delay time of the circuit network between registers uniform. However freedom for insertion position of registers is increased according to the fourth embodiment of the present invention because the delay time of each circuit network is controlled so as to coincide with the cycle time of the periodic signal of the externally input signal without making the delay time of registers uniform.

The integrated digital circuit 1 according to the sixth embodiment of the present invention will now be described with reference to FIG. 20. The integrated digital circuit 301, integrated with the digital circuit, according to this embodiment comprises an oscillation circuit 302 having MOS current mode circuits capable of controlling each signal frequency and current value by the corresponding signal frequency control signal and the current value control signal, a processor 303 having MOS current mode circuits capable of controlling each signal frequency and current value by the corresponding signal frequency control signal and the current value control signal, a signal frequency control signal line 401 and a current value control signal line 402 transferring the signals for controlling the signal amplitude and the current value of the current mode circuits of the oscillation circuit 302 and the processor 303, and an oscillation signal transfer line 403 to supply the oscillation signal output from the oscillation circuit 302 to the processor 303.

The oscillation circuit 302 has an arbitrary number of MOS current mode circuits cascaded and connected in ring form. The processor 303 has critical pat gates equal to or less than the number of the MOS current mode circuits of the oscillation circuit 302 and is synchronized to the oscillation signal from the oscillation circuit 302. Because both oscillation circuit 302 and processor 303 are thus constructed with the MOS current mode circuits, the circuit performance can be modified by controlling the signal frequency and the current value of the MOS current mode circuit with the signal frequency control signal and the current value control signal if any excursion of the actual circuit performance occurred from the target performance due to any variations in the device characteristics such as the threshold value of transistors in the active elements, the gate length and the like as well as variations in specification of the elements such as the resistance value and the capacitance value of the passive elements and changes of operating environments such as operation temperature of the integrated digital circuit, source voltage and the like. Further, because the processor circuit 303 is controlled by the signal frequency and the current value thereof so that the critical path is always operated according to the change of the oscillation signal from the oscillation circuit 302 with the cycle time thereof, it is always operated with desired synchronized frequency.

Figure 20:
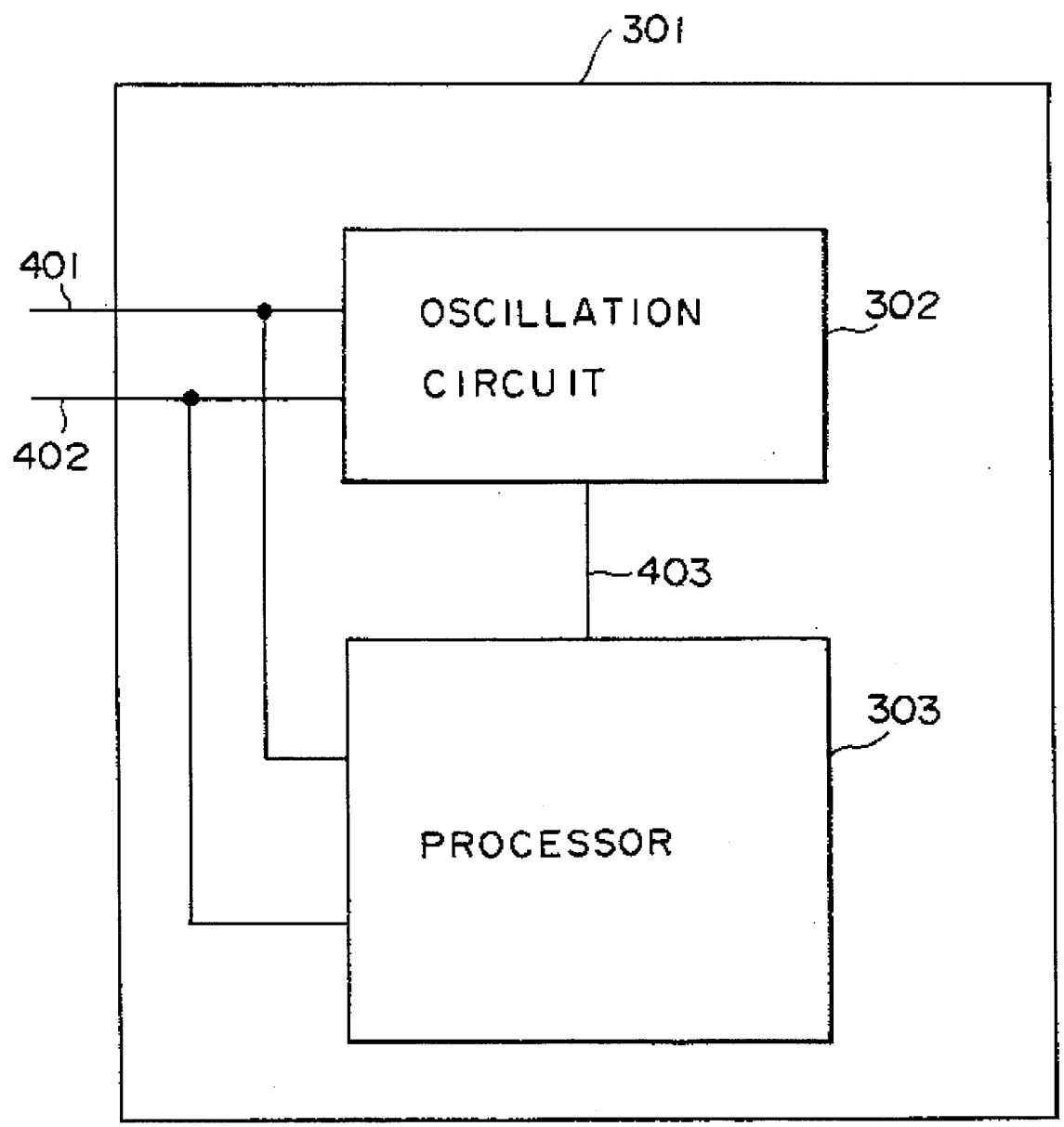
FIG. 20 is a block diagram showing the construction of an integrated digital circuit according to the sixth embodiment of the present invention.
Figure 21:
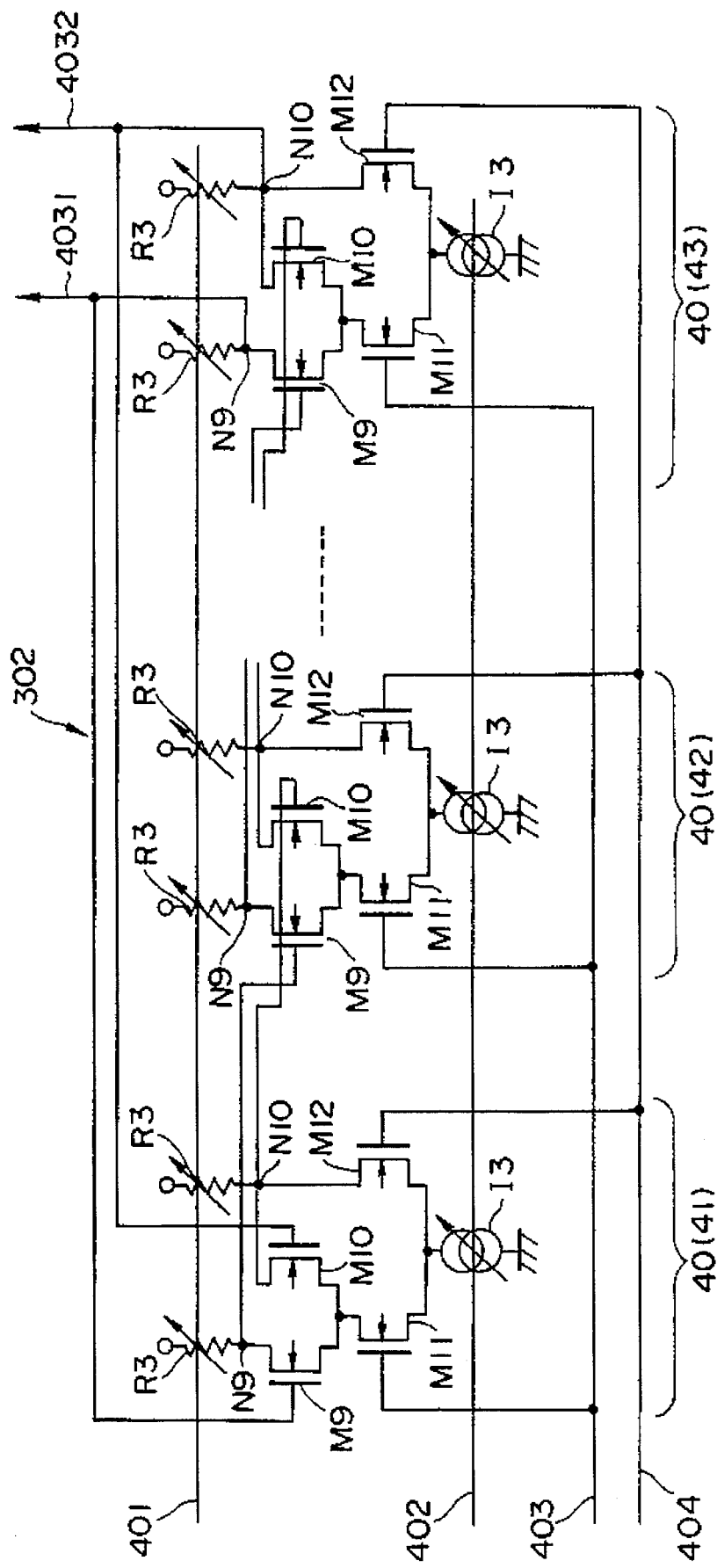
FIG. 21 is a circuit diagram showing one example of an oscillation circuit 2 of the integrated digital circuit according to the first embodiment of the present invention shown in FIG. 20.

FIG. 21 is a circuit diagram showing an example of the oscillation circuit 302. The oscillation circuit 302 comprises a signal amplitude control signal line 401, a current control signal line 402, a plurality of cascaded MOS current mode circuits 40 (41, 42, . . . 43), a supply line 401 of a high voltage of signal amplitude, and a supply line 402 of a low voltage of signal amplitude. Each MOS current mode circuit 40 also comprises variable resistors R3 capable of controlling the resistance value by the signal amplitude control signal from the signal amplitude control signal line 401, a variable current source I3 capable of controlling the current value by the current value control signal from the current value control signal line 402, and nMOS transistors M1 to M4 of differential pairs. Reference numerals 405 and 406 are oscillation signal transfer lines consisting of the oscillation signal transfer line 403 shown in FIG. 20.

In each MOS current mode circuit 40, a pair of variable resistors R3 is connected at one end thereof to each high voltage source and connected at another end thereof to the drain of the nMOS transistors M9 or M12. Both sources of the nMOS transistors M9 and M10 are connected to the drain of the nMOS transistor M11. Both sources of the nMOS transistors M11 and M12 are connected to one end of the variable current source I3. Another end of the variable current source I3 is grounded. The gate of the nMOS transistor M11 is connected to the high voltage supply source 403 and the gate of the nMOS transistor M12 is connected to the low voltage supply line 404.

Among these current mode circuits 40, one current mode circuit 41 is connected at the gate of nMOS transistor M9 thereof to the oscillation signal transfer line 4031 and also connected at the gate of nMOS transistor M10 thereof to the oscillation signal transfer line 4032. In the current mode circuit 42 located next to the current mode circuit 41, the gate of the nMOS transistor M9 thereof is connected to a node N9 between the resistance R3 and the nMOS transistor M9 of the current mode circuit 41 and the gate of the nMOS transistor M10 of the current mode circuit 42 is connected to a node N10 between the resistance R3 and the nMOS transistor M12 and to the drain of the nMOS transistor M10 of the current mode circuit 41.

Further, in the next current mode circuit following this current mode circuit 42, the gate of the nMOS transistor M9 thereof is connected to the node N9 of the current mode circuit 42 and the gate of the nMOS transistor M10 is connected to the node N10 and to the drain of nMOS transistor M10 of the current mode circuit 42. Thus, the adjoining current mode circuits are cascaded together.

Then, in the last current mode circuit 43, the node N9 thereof is connected to the gate of the nMOS transistor M9 of the first current mode circuit 41, and therefore connected to the oscillation signal transfer line 4031. The drain of the nMOS transistor M10 and the node N10 of the current mode circuit 43 are connected to the gate of the nMOS transistor M10 of the first current mode circuit 41, therefore connected to the oscillation signal transfer line 4032. Thus, each MOS current mode circuit 41, 42, . . . 43 is connected in ring form.

This MOS current mode circuit 40 functions as the NOR/OR or the NAND/AND circuit. The current mode circuit is fabricated into the oscillation circuit according to this embodiment of the present invention, but however, can be an inverter circuit shown in FIG. 6, for example, and thus not only as NOR/OR and NAND/AND circuits.

In the sixth embodiment shown in FIGS. 20 and 21, the oscillation frequency can be controlled by controlling the resistance value of the variable resistances R3 and the current value of the variable current source I3 by the signal amplitude control signal and the current value control signal. More detailed operation will be explained as follows.

If a low-frequency oscillation signal is necessary, the resistance value of the variable resistors R3 is increased and the current value of the variable current source I3 is reduced. If a high-frequency oscillation signal is necessary, the resistance value of the variable resistors R3 is reduced and the current source of the variable current source I3 is increased. By controlling as mentioned above, the oscillation frequency can be controlled maintaining the amplitude of signal at constant. The cycle of the oscillation signal is two times higher than the product obtained by multiplying the number of the MOS current mode circuits 4 cascaded with the delay time of one MOS current mode circuit.

Figure 22:
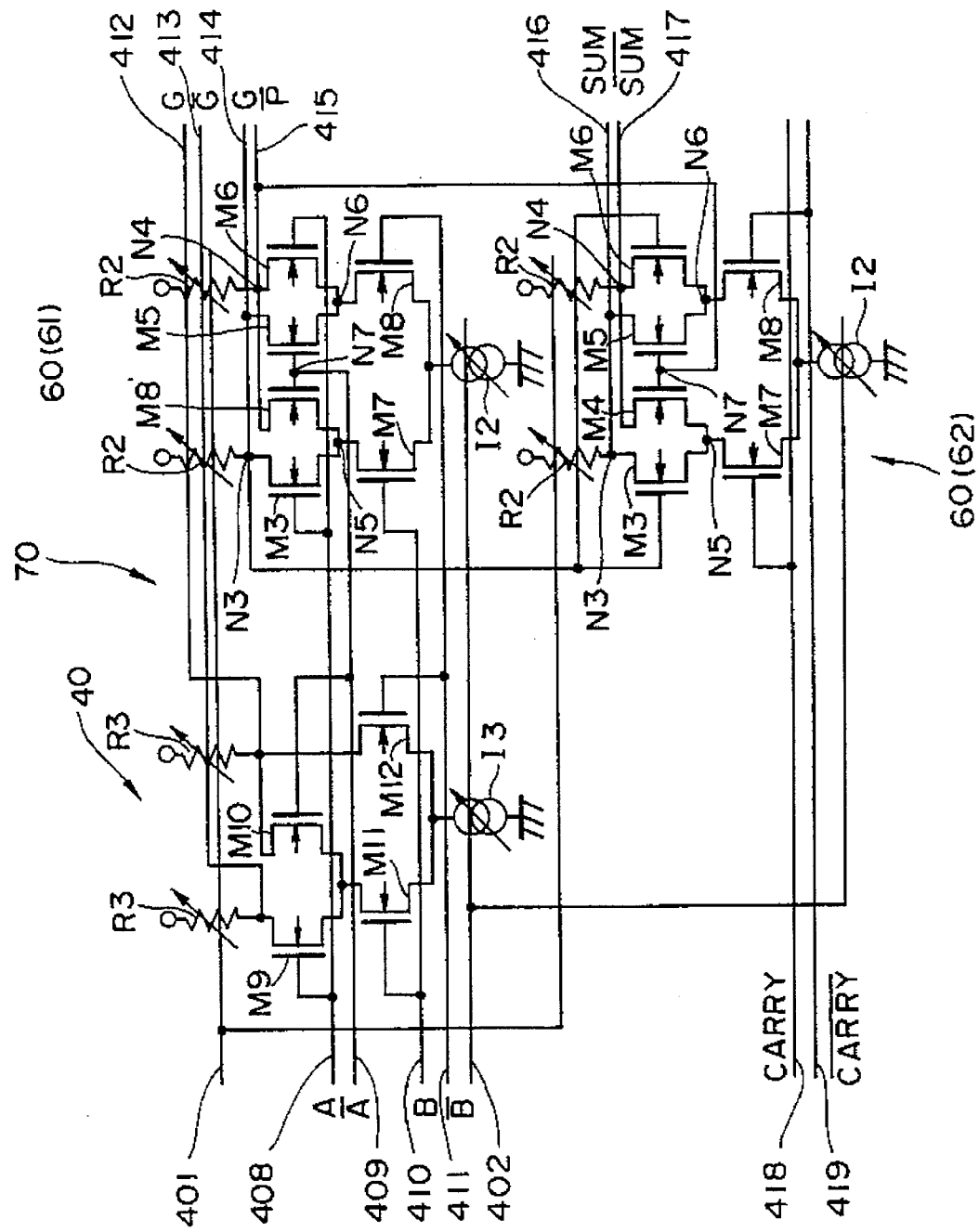
FIG. 22 is a circuit diagram showing one example of an adder circuit to be fabricated into the processor 3 of the integrated digital circuit according to the sixth embodiment of the present invention shown in FIG. 20.

FIG. 22 is a circuit diagram showing an adder 70 which is an important circuit constructing the processor 303. This adder 70 has three MOS current mode circuits. That is, the adder 70 has the NAND/AND circuit 40 shown in FIG. 21, and two EXOR/EXNOR circuits 60(61, 62) shown in FIG. 7. Input signal lines 408 and 409, 410 and 411, and 418 and 419 are input with each of a signal A and an inverted signal of the signal A, a signal B and an inverted signal of the signal B, and a carry signal and an inverted signal of the carry signal, respectively. Output signal lines 212 and 213, 214 and 215, and 216 and 217 are output with a carry signal G and an inverted signal of the signal G, a carry signal P and an inverted signal of the signal P, and a sum signal SUM and an inverted signal of the signal SUM, respectively.

In this adder 70, each gate of the transistors M9 and M10 of MOS current circuit 40 is connected to the input signal lines 4208 and 4209 each for the signal A or the inverted signal thereof, respectively, and each drain of the transistors M10 and M9 is connected to the output signal lines 412 and 413 each for the carry signal G or the inverted signal thereof, respectively. Further each gate of the transistors M11 and M12 is connected to the input signal lines 410 and 411 each for the signal B or the inverted signal thereof, respectively.

Further, each gate of the transistors M3 and M6 of another MOS current circuit 60(61) is connected to the input signal line 408 of the signal A, and each gate of the transistors M4 and M5 is connected to the input signal line 409 of the inverted signal of the signal A. Each gate of the transistors M7 and M8 is connected to the input signal lines 410 and 411 each for the signal B or the inverted signal thereof, respectively. Each of the nodes N3 and N4 is connected to the output signal lines 414 and 415 each for the carry signal P or the inverted signal thereof, respectively.

Each gate of the transistors M3 and M6 of another MOS current circuit 60(62) is connected to the output signal lines 414 for the carry signal P and each gate of the transistors M4 and M5 is connected to the output signal line 415 for the inverted signal of the carry signal P. Each gate of the transistors M7 and M8 is connected to the input signal lines 418 and 419 each for the carry signal or the inverted signal thereof, respectively. Each of the nodes N3 and N4 is connected to the output signal lines 416 and 417 each for the sum signal SUM or the inverted signal thereof, respectively.

In the adder 70 thus constructed, the delay time can be controlled by controlling the resistance value of the variable resistors R3 and R2 and the current value of the variable current source I3 and I2 with the signal amplitude control signal from the signal amplitude control signal line 401 and the current value control signal from the current value control signal line 402. That is, if the resistance value of the variable resistors is increased and the current value of the variable current source is reduced, the delay time can be increased, while the delay time can be reduced if the resistance value of the variable resistors is reduced and the current value of the variable current source is increased.

Figure 23:
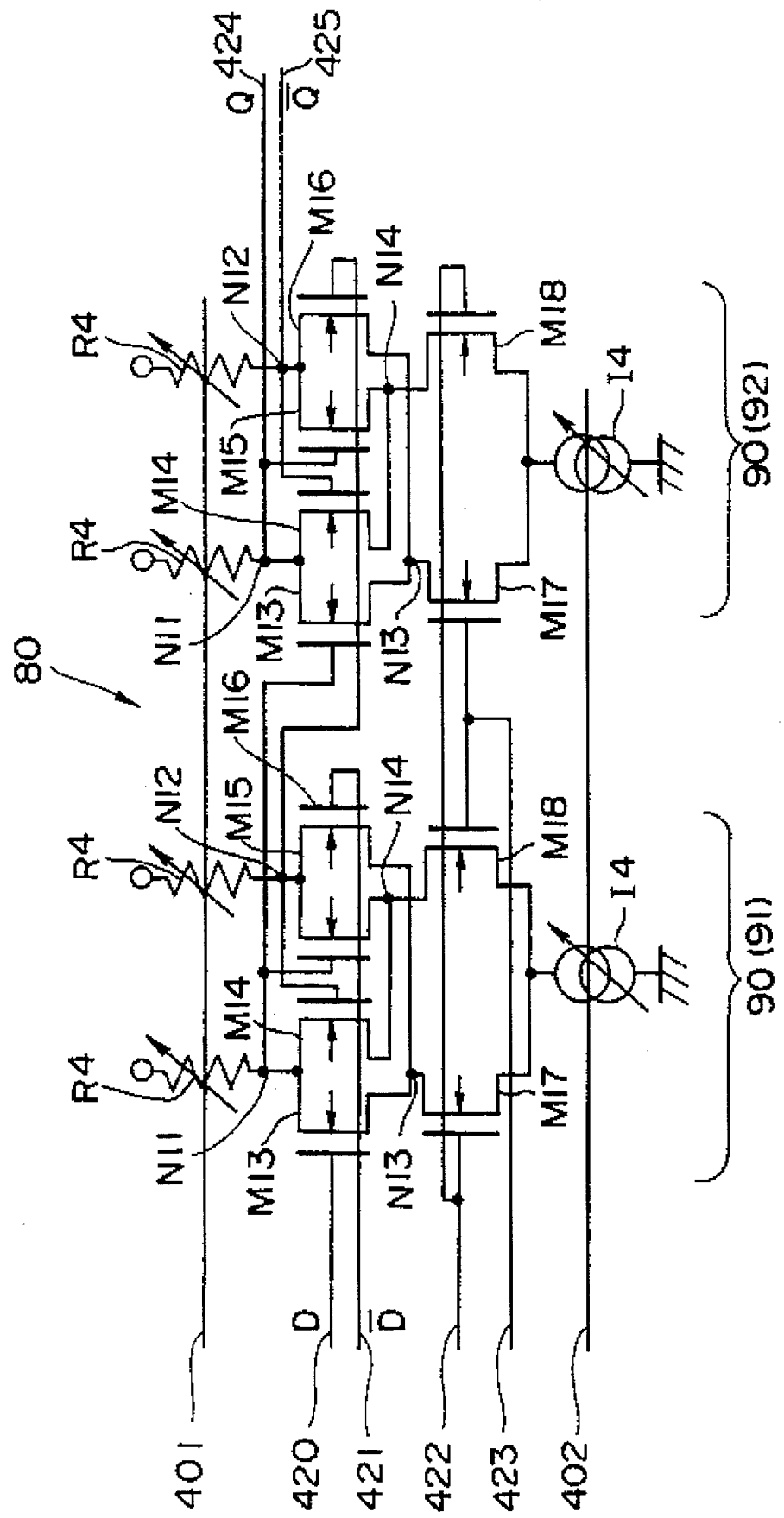
FIG. 23 is a circuit diagram showing one example of a flip-flop circuit to be fabricated into the processor 3 of the integrated digital circuit according to the first embodiment of the present invention shown in FIG. 20.

FIG. 23 is a circuit diagram showing a flip-flop 80 which is an important circuit constructing the processor 303. This flip-flop 80 comprises a signal amplitude control signal line 401, a current value control signal line 402, input signal lines 420 to 423, output signal lines 424 and 425, and two MOS current mode circuit 90(91,92). This MOS current circuit 90 comprises variable resistors R4 capable of controlling the resistance value by the signal amplitude control signal of the signal amplitude control signal line 401, a variable current source 14 capable of controlling the current value by the current value control signal of the current value signal line 402, and nMOS transistors M13 to M18 constructing the differential pairs.

The MOS current mode circuit 90 comprises the variable resistors R4 connected at one end thereof to a high voltage source, the nMOS transistors R13 and M14 connected at the drain thereof to the other end of the variable resistor R4 through a node N11, the nMOS transistors M15 and M16 connected at the drain thereof to the other end of the variable resistor R4 through a node N12, the nMOS transistor M17 connected at the drain thereof to each source of the transistors M13 and M16 through a node N13, the nMOS transistor M18 connected at the drain thereof to each source of the transistors M14 and M15 through a node N14, and the variable current source I4 connected to each source of the transistors M17 and M18. The gate of the transistor M14 is connected to the node N12, and the gate of the transistor M15 is connected to the node N11.

In current mode circuit 91, each gate of the transistors M13 and M16 is connected to signal input lines 420 and 421 each for data signal D and the inverted signal thereof, respectively. And each gate of the transistors M13 and M16 is connected to signal input lines 422 and 423 each for synchronized signal E and the inverted signal thereof, respectively.

Further in another current mode circuit 92, each gate of the transistors M13 and M16 is connected to the nodes N11 and N12 in the current mode circuit 91, respectively. And, each gate of the transistors M18 and M17 is connected to the input signal lines 422 and 423 each for the synchronized signal E or the inverted signal thereof, respectively.

In the flip-flop circuit 80 thus constructed, the complementarily operating data signal D is input through the input signal lines 420 and 421, and the complementarily operating synchronized signal E is input through the input signal lines 422 and 423. As the results, store data Q and the inverted signal of Q are output to the output signal lines 424 and 425, respectively. The delay time tpd of this circuit can be controlled by controlling the resistance value of the variable resistor R4 and the current value of the variable current source I4 by the signal amplitude control signal and the current value control signal. The delay time tpd can be increased if the resistance value of the variable resistor R4 is increased and the current value of the variable current source I4 is reduced, while the delay time tpd can be reduced if the resistance value of the variable resistor R4 is reduced and the current value of the variable current source I4 is increased.

Figure 24:
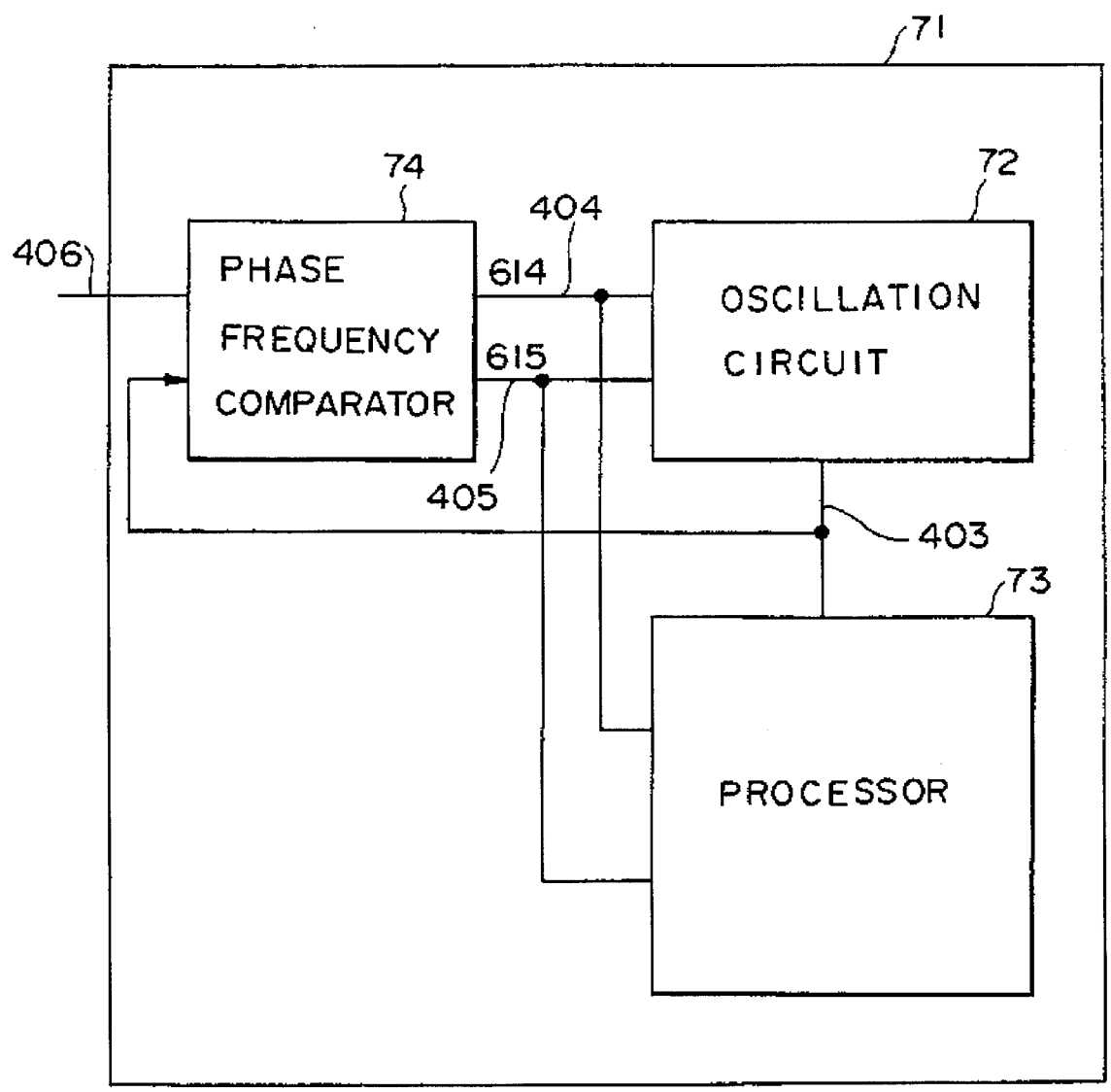
FIG. 24 is a block diagram showing the construction of an integrated digital circuit according to the seventh embodiment of the present invention.

Next, and integrated digital circuit 71 according to the seventh embodiment of the present will be described hereinafter referring to FIG. 24 showing the circuit diagram thereof. The integrated digital circuit 71 according to this embodiment comprises an oscillation circuit 72 having MOS current mode circuits capable of controlling the signal amplitude and the current value by the signal amplitude control signal and the current value control signal, respectively, a processor 73 having MOS current mode circuits capable of controlling the signal amplitude and the current value by the signal amplitude control signal and the current value control signal, respectively, a phase frequency comparator 74 comparing the phase and the frequency between the external synchronized signal and the oscillation signal output by the oscillation circuit, an external synchronized signal line 406 transferring the external synchronized signal to the phase frequency comparator 74, a signal amplitude control signal line 404 and a current value control signal line 405 transferring signals 614 and 615 which control each of the signal amplitude and the current value of the current mode circuit constructing the oscillation circuit 72 and the processor 73, and an oscillation signal transfer line 403 supplying the oscillation signal output from the oscillation circuit 72 to the processor 73. The oscillation circuit 72 has an arbitrary number of MOS current circuits cascaded in ring-form, and the processor 73 has critical path gates equal to or less than the cascaded number of the MOS current mode circuits in the oscillation circuit 72 so as to be synchronized by the oscillation signal from the oscillation circuit 72. The construction of the MOS current mode circuit is the same as the MOS current mode circuit described above.

When any deviation or degradation occurs in the circuit performance from the desired performance due to variations in the device characteristics such as the threshold value and the gate length as well as variations in specification of the elements such as the resistance value and the capacitance value and changes of operating environments such as temperature, the circuit performance can be modified by controlling the signal amplitude and the current value in the MOS current mode circuit with the signal amplitude control signal 614 and the current value control signal 615. Further, the processor circuit 73 is always operated at the desired synchronized frequency because the signal amplitude and the current value are controlled so that the critical path is always operated within the cycle time thereof according to the change of the oscillation frequency of the oscillation circuit 72.

In this embodiment, the phase frequency comparator 74 outputs the signal amplitude control signal 704 and the current value control signal 705 so as to equalize the frequency of the external synchronized signal input externally with that of the oscillation signal from the oscillation circuit 72 so that the signal amplitude and the current value of the current mode circuit forming the oscillation circuit 72 and the processor 73. Because the signal amplitude control signal 614 and the current value control signal 615 are automatically output inside the integrated circuit 71, the integrated circuit 71 can be input externally with only the synchronized signal and therefore easily controlled.

Figure 25:
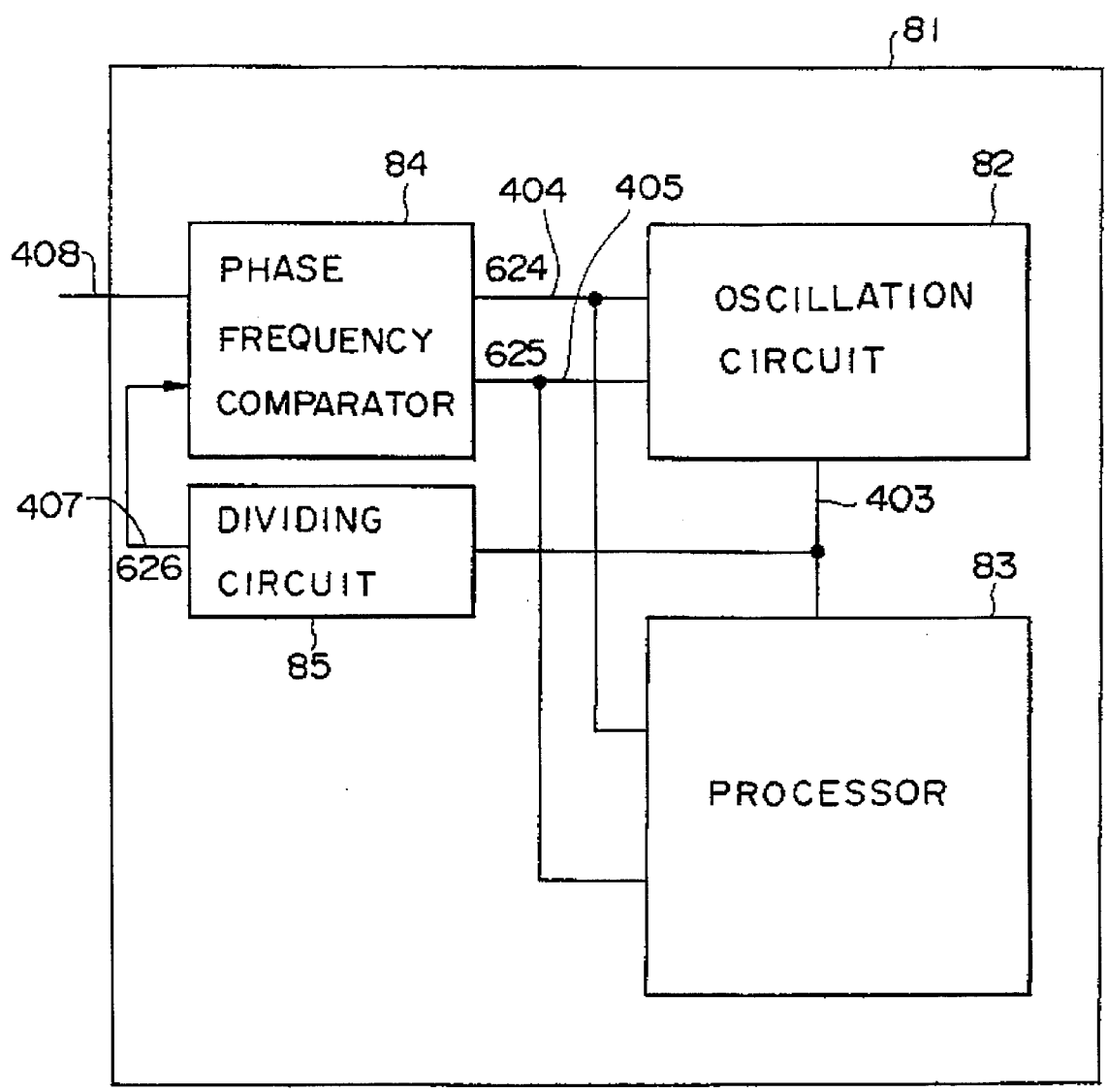
FIG. 25 is a block diagram showing the construction of an integrated digital circuit according to the eighth embodiment of the present invention.

An integrated digital circuit 81 according to the eighth embodiment of the present invention will be described hereinafter referring to FIG. 25. The integrated digital circuit 81 according to this embodiment comprises an oscillation circuit 82 having MOS current mode circuits capable of controlling the signal amplitude and the current value by the signal amplitude control signal 624 and the current value control signal 625, respectively, a processor 83 having MOS current mode circuits capable of controlling the signal amplitude and the current value by the signal amplitude control signal 624 and the current value control signal 625, respectively, a phase frequency comparator 84 comparing the phase and the frequency between the external synchronized signal and a divided oscillation signal 626 output by a dividing circuit 85, the dividing circuit 85 dividing the oscillation signal output by the oscillation circuit at an arbitrary proportion and outputting said divided oscillation signal, an external synchronized signal line 408 transferring the external synchronized signal to the phase frequency comparator 84, a signal amplitude control signal line 404 and a current value control signal line 405 transferring signals which control each of the signal amplitude and the current value of the current mode circuit forming the oscillation circuit 82 and the processor 83, an oscillation signal transfer line 403 supplying the oscillation signal output from the oscillation circuit to the processor, and divided oscillation signal line 407 transferring the divided oscillation signal output from the dividing circuit 85 to the phase frequency comparator 84.

The oscillation circuit 82 has an arbitrary number of MOS current circuits cascaded in ring-form, and the processor 83 has critical path gates equal to or less than the cascaded number of the MOS current mode circuits in the oscillation circuit 82 so as to be synchronized by the oscillation signal from the oscillation circuit 82.

When any deviation or degradation occurs in the circuit performance from the desired performance due to variations in the device characteristics such as the threshold value and the gate length as well as variations in specification of the elements such as the resistance value and the capacitance value of the wiring and changes of operating environments such as temperature, the circuit performance can be modified by controlling the signal amplitude and the current value in the MOS current mode circuit with the signal amplitude control signal 624 and the current value control signal 625. Further, the processor circuit 83 is always operated at the desired synchronized frequency because the signal amplitude and the current value are controlled so that the critical path is always operated within the cycle times thereof according to the change of the oscillation frequency of the oscillation circuit 82.

In this embodiment, the dividing circuit 85 divides the oscillation signal output from the oscillation circuit 82 so that both the external synchronized signal and the divided oscillation signal to be compared by the phase frequency comparator 84 become a relatively low frequency. Therefore, external input of a high frequency synchronized signal is not needed even outputting a high frequency oscillation signal from the oscillation circuit 82, making the design of an input/output circuit exchanging signal between the inside and the outside of the integrated circuit and resulting in reduction of power consumed in the input/output circuit.

In the embodiments described above, although the MOS current mode circuit was referred to as the current mode circuit, a differential pair of bipolar transistors, a differential pair of GaAs MES transistors, and a differential pair of GaAs DMTs may be used instead of the differential pair of MOS transistors. Also, the variable resistance and the variable current source may be prepared using MOS, bipolar, GaAs MES and GaAs DMT.

What is claimed is:

1. An integrated digital circuit comprising:

at least two registers for constructing a synchronized circuit, and for respectively receiving a first synchronized signal and a second synchronized signal;

a circuit network for constructing a logic circuit or a memory circuit and connected between at least two of said registers, the circuit network having a gate circuit, connected between said at least two of said registers, for receiving a first control signal.

a control signal generating circuit for generating second and third control signals from said first and second synchronized signals respectively supplied to said registers;

a replica delay circuit, coupled to said circuit network, having a plurality of gate circuits connected in a line, a number of said plurality of gate circuits being proportional to a number of gates of a critical path in said circuit network, said replica delay circuit for inputting said second control signal; and a control circuit, coupled to said replica delay circuit and to said circuit network, for outputting said first control signal for controlling said delay times of said circuit network and said replica delay circuit so as to equalize a phase of a signal output from said replica delay circuit with a phase of signal externally input to said integrated digital circuit, determined based on a phase of said third control signal.

* * * * *